(12) United States Patent
Matsushima et al.

(10) Patent No.: US 7,911,045 B2
(45) Date of Patent: Mar. 22, 2011

(54) SEMICONDUCTOR ELEMENT AND SEMICONDUCTOR DEVICE

(75) Inventors: Ryoji Matsushima, Yokkaichi (JP); Naohisa Okumura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 320 days.

(21) Appl. No.: 12/191,574

(22) Filed: Aug. 14, 2008

(65) Prior Publication Data
US 2009/0045525 A1    Feb. 19, 2009

(30) Foreign Application Priority Data

Aug. 17, 2007  (JP) ................. P2007-212712
Feb. 18, 2008  (JP) ................. P2008-035810

(51) Int. Cl.
*H01L 23/02* (2006.01)
(52) U.S. Cl. ............ 257/686; 257/777; 257/E25.006
(58) Field of Classification Search .......... 257/686, 257/777, 787, 781, E25.006, E25.013
See application file for complete search history.

(56) References Cited

U.S. PATENT DOCUMENTS

| | | | |
|---|---|---|---|
| 6,621,155 B1 | 9/2003 | Perino et al. | |
| 6,653,731 B2 | 11/2003 | Kato et al. | |
| 6,747,348 B2 * | 6/2004 | Jeung et al. | 257/686 |
| 7,342,309 B2 | 3/2008 | Yoshida | |
| 7,432,128 B2 | 10/2008 | Yoshida | |
| 7,595,222 B2 | 9/2009 | Shimoishizaka et al. | |
| 2002/0027295 A1 | 3/2002 | Kikuma et al. | |
| 2002/0038905 A1 | 4/2002 | Sugizaki | |
| 2003/0006493 A1 | 1/2003 | Shimoishizaka et al. | |
| 2004/0155326 A1 | 8/2004 | Kanbayashi | |
| 2004/0159924 A1 | 8/2004 | Tokumitsu et al. | |
| 2004/0164392 A1 | 8/2004 | Lee | |
| 2005/0148160 A1 | 7/2005 | Farnworth et al. | |
| 2006/0192230 A1 | 8/2006 | Wood et al. | |

FOREIGN PATENT DOCUMENTS

| | | |
|---|---|---|
| JP | 11-219962 | 8/1999 |
| JP | 2000-307036 | 11/2000 |
| JP | 2001-168132 | 6/2001 |
| JP | 2001-244281 | 9/2001 |
| JP | 2003-86762 | 3/2003 |
| JP | 2004-63569 | 2/2004 |
| JP | 2004-253422 | 9/2004 |
| JP | 2005-302763 | 10/2005 |
| JP | 2006-313798 | 11/2006 |

* cited by examiner

*Primary Examiner* — Hoai V Pham
(74) *Attorney, Agent, or Firm* — Oblon, Spivak, McClelland, Maier & Neustadt, L.L.P.

(57) ABSTRACT

A semiconductor element is provided with electrode pads which are arranged on a front surface of an element main body, an insulating protection film which covers the front surface of the element main body excepting its outer peripheral area while exposing the electrode pads, and an insulating adhesive layer which is formed to cover a back surface, a sidewall surface and a corner between the front surface and the sidewall surface of the element main body. A plurality of semiconductor elements are stacked on a circuit substrate. The semiconductor elements are adhered via the insulating adhesive layer.

9 Claims, 14 Drawing Sheets

SEMICONDUCTOR ELEMENT AND SEMICONDUCTOR DEVICE

CROSS-REFERENCE TO RELATED APPLICATIONS

This application is based upon and claims the benefit of priority from the prior Japanese Patent Application No. 2007-212712 filed on Aug. 17, 2007 and Japanese Patent Application No. 2008-035810 filed on Feb. 18, 2008; the entire contents of which are incorporated herein by reference.

BACKGROUND OF THE INVENTION

To realize miniaturization and high-density packaging of the semiconductor device, a stacked semiconductor device (semiconductor package) having plural semiconductor elements stacked and sealed in one package has been realized. In the stacked semiconductor device, the plural semiconductor elements are sequentially stacked on a wiring board or a circuit board such as a lead frame via an adhesive layer. The electrode pads of the semiconductor elements are electrically connected via the metallic wires and the connection pads of the circuit substrate. Thus, the stacked semiconductor is configured by sealing the laminated body with a resin.

For example, a memory card (semiconductor memory card) having a NAND-type flash memory therein is being downsized and provided with high capacity rapidly. For realization of a downsized memory card, a semiconductor element such as a memory element or a controller element is mounted in a stacked form on a wiring board. The electrode pads of the semiconductor element are electrically connected to the connection pads of the wiring board by wire bonding. Besides, to provide the memory card with high capacity, the memory elements have come to be also stacked into multiple layers on the wiring board.

The front surface of the semiconductor element is covered with an insulating protection film, but an outer peripheral portion of the front surface is not covered with the insulating protection film, so that a semiconductor substrate and a wiring layer configuring the semiconductor element are exposed on the corners between the front surface and the sidewall surface. In a case where wire bonding is applied to the semiconductor element, it is necessary to perform wiring of the metallic wires while keeping a loop height such that they do not come into contact with the corners of the semiconductor element. The stacked semiconductor device is demanded that the laminate thickness of plural semiconductor elements and therefore the package thickness are reduced. Meanwhile, the loop height of the metallic wires connected to the semiconductor elements of the top layer becomes a cause of increasing the package thickness.

Specifically, the metallic wires connected to the semiconductor elements on the top layer are arranged so as to inevitably pass through portions which exceed the laminate thickness of the plural semiconductor elements. In a case where the laminated body of the semiconductor elements having the metallic wires in the above described form is sealed with a resin, the sealing resin is required to have a thickness equivalent to the shapes of the wires connected to the semiconductor elements of the top layer. Thus, the package thickness is caused to be made large. Besides, the metallic wires distributed while keeping the loop height have a disadvantage that wire sweep is easily caused at the time of resin sealing. The wire sweep becomes a cause of inducing a short circuit because of a contact between adjacent wires having different potentials.

JP-A 2000-307036 (KOKAI) describes that a resin block is arranged on a substrate to cover a part and the sidewall surface of an electrode formation surface of a semiconductor element so as to prevent a contact between the corners of the semiconductor element and the metallic wires. In a case where the semiconductor elements are stacked into multiple layers, the resin block cannot prevent the contact of the metallic wires with the semiconductor elements. JP-A 2001-244281 (KOKAI) describes that a protection resin layer is formed on a sidewall surface and a back surface (surface opposite to the bump electrode-formed surface) of a flip-chip mounting semiconductor element. Here, a multilayer lamination of the semiconductor elements is not taken into consideration because the flip-chip mounting semiconductor element is under consideration.

Besides, there is a tendency that the number of memory elements stacked on the memory card is increased. For example, it is being studied to stack into four, eight or more layers depending on the storage capacity of the memory card. To stack the semiconductor elements into multiple layers, it is necessary to reduce the thickness of each element. When the wire bonding is applied to the semiconductor elements having a reduced thickness, the semiconductor elements might be damaged by a bonding load. Accordingly, it is being studied to stack the plural semiconductor elements into a step-like shape to expose the electrode pads and to electrically connect between the electrode pads of the plural semiconductor elements and between the electrode pads and the connection pads of the wiring board with a conductive layer (see JP-A 2004-063569 (KOKAI) and JP-A 2005-302763 (KOKAI)).

In a case where plural semiconductor elements are simply stacked to have a step-like shape, a length in the stepped direction becomes long with the increase in the number of stacked semiconductor elements, and an occupied area of the semiconductor elements to the wiring board increases. Meanwhile, the occupied area of the semiconductor elements to the wiring board can be decreased by stacking the plural element groups, which have the semiconductor elements stacked to have the step-like shape, via a spacer layer, or stacking the plural element groups in a direction opposite to the stepped direction. Though the conductive layer can be applied to the connection between the electrode pads in the element groups, it becomes hard to connect the semiconductor elements of the element group located at a higher position with the wiring board by the conductive layer.

For electrode pads having the same electric properties and signal characteristics, the electrode pads of plural semiconductor elements stacked to have a step-like shape can be connected sequentially by the conductive layer. But, for electrode pads for control signals to perform chip select, the individual electrode pads of the plural semiconductor elements are occasionally required to be connected to the connection pads of the wiring board according to the control signals. Such a connection structure can be realized by wire bonding of metallic wires at an incidence angle. But, for connection between the semiconductor element and the wiring board, it is hard to connect the electrode pads of the plural semiconductor elements to the connection pads respectively by applying a conductive layer.

BRIEF SUMMARY OF THE INVENTION

A semiconductor element according to an aspect of the present invention, includes: an element main body having a front surface, a sidewall surface, and a back surface; electrode pads arranged on the front surface of the element main body; an insulating protection film which covers the front surface of the element main body excepting its outer peripheral area with the electrode pads exposed; and an insulating adhesive layer which is formed to cover at least the back surface, the sidewall surface, and a corner between the front surface and the sidewall surface of the element main body.

A semiconductor device according to a first aspect of the present invention, includes: a circuit substrate which has an element mounting section and connection points; an element group which has a plurality of the semiconductor elements according to the aspect of the present invention stacked on the element mounting section of the circuit substrate, the plurality of the semiconductor elements being adhered via the insulating adhesive layer; connection members which electrically connect the connection points of the circuit substrate and the electrode pads of the semiconductor elements; and a sealing portion which seals the element group and the connection members.

A semiconductor device according to a second aspect of the present invention, includes: a wiring board having connection pads; an element group including a relay element, disposed on the wiring board, having relay pads arranged along its outline side, and a plurality of semiconductor elements, disposed on the relay element, having electrode pads arranged along its outline side, the relay element and the plurality of semiconductor elements being stacked to have a step-like shape with the outline sides directed in the same direction and to expose the relay pads and the electrode pads; conductive layers which electrically connect the electrode pads of the semiconductor elements and the relay pads of the relay element; metallic wires which electrically connect the relay pads of the relay element and the connection pads of the wiring board; and a sealing resin layer which is formed on the wiring board to seal the element group together with the metallic wires.

A semiconductor device according to a third aspect of the present invention, includes: a wiring board having connection pads; a first element group including a first relay element, disposed on the wiring board, having relay pads arranged along its outline side, and a plurality of semiconductor elements, disposed on the first relay element, having electrode pads arranged along its outline side, the first relay element and the semiconductor elements being stacked to have a step-like shape with the outline sides directed in the same direction and to expose the relay pads and the electrode pads; first conductive layers which electrically connect the electrode pads of the semiconductor elements configuring the first element group and the relay pads of the first relay element; first metallic wires which electrically connect the relay pads of the first relay element and the connection pads of the wiring board; a second element group including a second relay element, disposed on the first element group, having relay pads arranged along its outline side, and a plurality of semiconductor elements, disposed on the second relay element, having electrode pads arranged along its outline side, the second relay element and the semiconductor elements being stacked to have a step-like shape with the outline sides directed in the same direction and to expose the relay pads and the electrode pads; second conductive layers which electrically connect the electrode pads of the semiconductor elements configuring the second element group and the relay pads of the second relay element; second metallic wire which electrically connect the relay pads of the second relay element and the connection pads of the wiring board; and a sealing resin layer which is formed on the wiring board to seal the first and second element groups together with the first and second metallic wires.

A semiconductor device according to a fourth aspect of the present invention, includes: a wiring board having connection pads; an element group including a plurality of semiconductor elements, disposed on the wiring board, having electrode pads arranged along its outline side, the semiconductor elements being stacked to have a step-like shape with the outline sides directed in the same direction and to expose the electrode pads; conductive layers which connect at least between the electrode pads of the semiconductor elements; and a sealing resin layer which is formed on the wiring board to seal the element group, wherein the conductive layers are partially routed on exposed surfaces corresponding to step surfaces of step sections of the semiconductor elements.

DETAILED DESCRIPTION OF THE INVENTION

Figure 1:
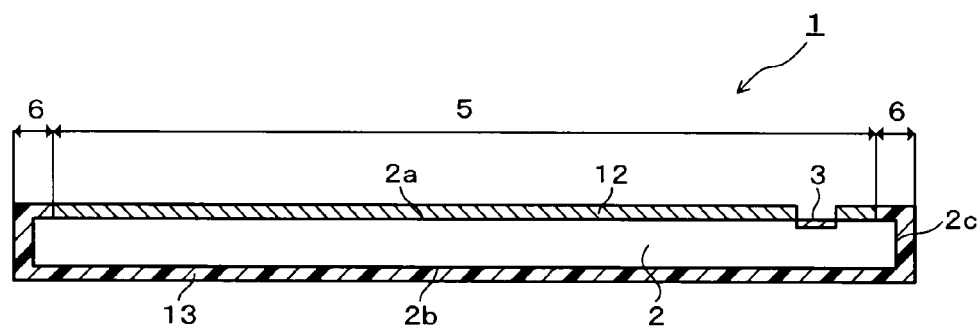
FIG. 1 is a cross sectional view showing a semiconductor element according to an embodiment of the present invention.
Figure 2:
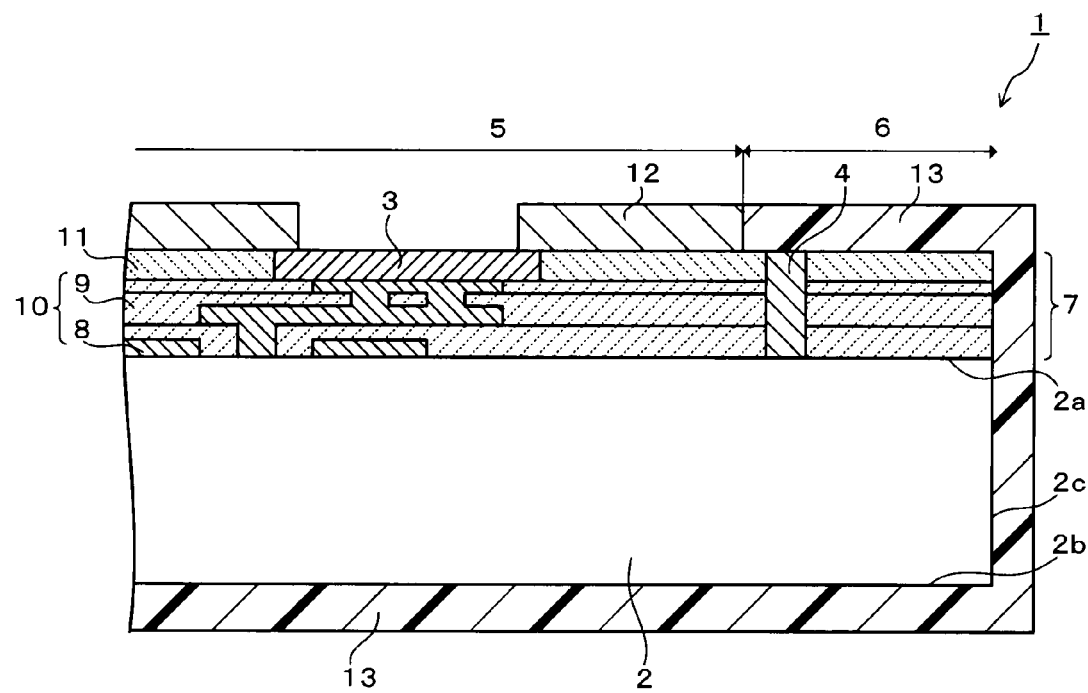
FIG. 2 is a cross sectional view showing the semiconductor element of FIG. 1 in a partly enlarged form.

Modes of conducting the present invention will be described below with reference to the drawings. FIG. 1 and FIG. 2 are diagrams showing a semiconductor element according to an embodiment of the present invention. FIG. 1 is a cross sectional view of the semiconductor element. FIG. 2 is a cross sectional view showing a part of FIG. 1 in an enlarged state. A semiconductor element 1 shown in the drawings has a semiconductor substrate (such as Si substrate) 2 as a semiconductor element main body. Electrode pads (such as Al pads) 3 are arranged on a front surface 2a of the semiconductor substrate 2.

The semiconductor substrate 2 configuring the semiconductor element 1 has an element area 5 surrounded by a chip ring 4 and an outer peripheral area 6 corresponding to its outer periphery. The outer peripheral area 6 corresponds to a dicing region when a semiconductor wafer is cut to singulate the semiconductor element 1. An element structure including unshown transistors is formed within the element area 5 of the semiconductor substrate 2. In addition, a laminated film 7 having a multi-layer wiring film, a passivation film and the like is formed on the front surface 2a of the semiconductor substrate 2. The chip ring 4 is arranged within the laminated film 7.

The laminated film 7 has a passivation film 11 and a wiring layer 10 having a multi-layer structure configured of a metal wiring 8 of Cu wires or the like and an insulating film 9. The metal wiring 8 is provided within the element area 5. One end of the metal wiring 8 is connected to the electrode pad 3. The electrode pad 3 formed of Al pads or the like is formed on the metal wiring 8. The insulating film 9 functions as an interlayer insulating film of the metal wiring 8 and is formed of, for example, $SiO_x$ film, a low dielectric constant insulating film or the like. As the low dielectric constant insulating film, silicon oxide (SiOF) doped with fluorine, silicon oxide (SiOC) doped with carbon, organic silica, porous body of them, or the like is usable. The passivation film 11 which is formed of an insulating film such as $SiO_x$ film, $SiN_x$ film or the like is formed on the wiring layer 10.

As an insulating protection film (element protection film) 12, an insulating resin layer having a polyimide resin or the like is formed on the passivation film 11. The passivation film 11 and the insulating protection film 12 are formed to expose the electrode pads 3 out of the front surface of the semiconductor element 1. The passivation film 11 is formed on the whole of the front surface 2a of the semiconductor substrate 2, but the insulating protection film 12 is formed to cover the element area 5. In other words, the insulating protection film 12 is formed to cover the front surface 2a of the semiconductor substrate 2 excepting the outer peripheral area 6.

The outer peripheral area 6 of the semiconductor substrate 2 does not have the insulating protection film 12. It is because the outer peripheral area 6 corresponds to the dicing region of the semiconductor wafer. If the insulating protection film (insulating resin layer such as a polyimide resin layer) 12 is formed to include the outer peripheral area (dicing region) 6, the insulating protection film 12 is separated, or the blade is clogged by the insulating protection film 12 to easily cause a cut failure (chipping, crack or the like) when the semiconductor wafer is subjected to blade dicing.

Since the conventional semiconductor element is undergone the wire bonding in the above-described state, the bonding wire (metallic wire) needs to maintain a loop height so as not to come into contact with the corners of the semiconductor element which are not covered with the insulating protection film. Meanwhile, the semiconductor element 1 of this embodiment has an insulating adhesive layer 13 which is formed to cover a back surface 2b, a sidewall surface 2c and a portion not provided with the insulating protection film 12 in the front surface 2a of the semiconductor substrate 2, namely the outer peripheral area 6 (the area excluding the element area 5). In the outer peripheral area 6 of the front surface 2a, at least portion which a conductive part is exposed is covered with the insulating adhesive layer 13.

The insulating adhesive layer 13 may be formed to cover at least from the back surface 2b to the sidewall surface 2c of the semiconductor substrate 2 and further to cover the corner between the sidewall surface 2c and the front surface 2a. The insulating adhesive layer 13 arranged on the back surface 2b of the semiconductor substrate 2 is used as an adhesive agent between the circuit substrate and the semiconductor element 1 when the semiconductor element 1 is mounted by stacking on the circuit substrate as described later or as an adhesive agent between the plural semiconductor elements 1.

The insulating adhesive layer 13 preferably has a thickness of 5 μm or more. If the insulating adhesive layer 13 has a thickness of less than 5 μm, there is a possibility that the adhesion properties between the circuit substrate and the semiconductor element 1 or the adhesion properties between the semiconductor elements 1 are degraded. In a case where the insulating adhesive layer 13 is simply used as an adhesive agent, the laminate thickness of the plural semiconductor elements 1 merely increases when the insulating adhesive layer 13 is excessively thick. Therefore, it is preferable that the insulating adhesive layer 13 has a thickness of 30 μm or less. Typically, the insulating adhesive layer 13 has a thickness of, for example, 10 μm.

Besides, to provide the insulating adhesive layer 13 with a function as the spacer layer, its thickness is preferably determined to be 60 μm or less. And, it is desirable that the insulating adhesive layer 13 has a thickness of 20 μm or more. The insulating adhesive layer 13 having the function as the spacer layer is described in detail later. The insulating adhesive layer 13 is not required to have a uniform thickness but may have its portion for covering, for example, only the back surface 2b of the semiconductor substrate 2 provided with a large thickness.

The semiconductor element 1 of this embodiment has the insulating adhesive layer 13, which is used as an adhesive agent against the circuit substrate or an adhesive agent between the semiconductor elements 1, formed on not only the back surface 2b of the semiconductor substrate 2 but also on the sidewall surface 2c and the outer peripheral area 6 (at least the corner between the sidewall surface 2c and the front surface 2a) of the front surface 2a. The surface of the semiconductor element 1 is covered with the insulating protection film 12 and the insulating adhesive layer 13, and the corners of the semiconductor element 1 are also covered with the insulating adhesive layer 13. For example, the insulating adhesive layer 13 is formed of a thermosetting insulating resin having adhesion properties.

The corners of the semiconductor element 1 are covered with the insulating adhesive layer 13, so that it is not necessary to keep the loop height of the metallic wires (connection member), which electrically connect between the electrode pads 3 and the connection points of the circuit substrate, so as not to contact the wires to the corners of the semiconductor element 1. The metallic wires may be positively connected to the front surface and corners of the semiconductor element 1. Therefore, it is possible to make wiring of the metallic wires, which are connected to the electrode pads 3, with the loop height suppressed. For example, the metallic wires are routed on the front surface of the semiconductor element 1, so that the loop height can be set to the minimum height defined by the height of the connection points with the electrode pads 3. Besides, if the connection height can be lowered, it can be made same as the wire diameter.

The front surface of the semiconductor element 1 is covered with the insulating protection film 12 and the insulating adhesive layer 13, and the sidewall surface is also covered with the insulating adhesive layer 13. It also becomes possible to apply the conductive layer (coated layer of a conductive material) instead of the wire bonding for connection with the electrode pads 3. Since a conductive paste or a conductive coating can be applied directly to the front surface and the sidewall surface of the semiconductor element 1, it becomes possible to connect between the electrode pads 3 of the semiconductor element 1 and the circuit substrate, and also between the electrode pads 3 of the stacked semiconductor elements 1 by the conductive layer. By applying the conductive layer instead of the metallic wires as a member for connection with the electrode pads 3, the height of the connection member can be further lowered.

As described above, by suppressing the loop height of the metallic wires as the connection member to a low level and by applying the conductive layer as the connection member, the thickness of the sealing material and therefore the thickness of the semiconductor device can be made small when the plural semiconductor elements 1 are packaged by stacking as described later. Besides, in a case where the metallic wires are used as the connection member, the wire sweep can be suppressed at the time of resin sealing by contacting at least some of the metallic wires to the front surface of the semiconductor element. Thus, it is possible to realize the semiconductor device (semiconductor package) with the plural semiconductor elements mounted in the stacked form, which is produced small and thin in size with high yield and high reliability.

A production process of the above-described semiconductor element 1 is described below. First, a semiconductor wafer excepting the insulating adhesive layer 13 is produced according to an ordinary semiconductor element production process. The semiconductor wafer has plural element areas and dicing regions which are provided in a grid pattern to divide the element areas. Integrated circuits including transistors and wires are formed in the respective element areas. The laminated film 7 and the insulating protection film 12 are formed on the front surface of the semiconductor wafer. As described above, the insulating protection film 12 is formed in the element area.

Figure 3A:
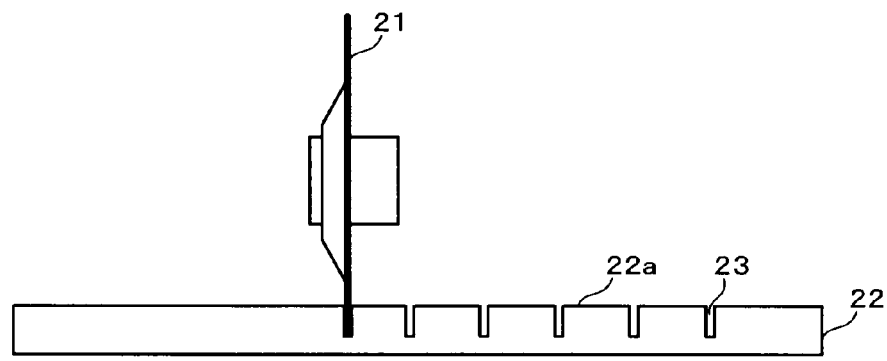
FIG. 3A through FIG. 3C are cross sectional views showing a wafer step in a production process of the semiconductor element shown in FIG. 1.
Figure 3B:
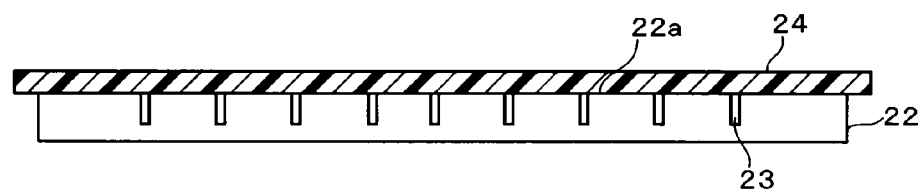
Figure 3C:
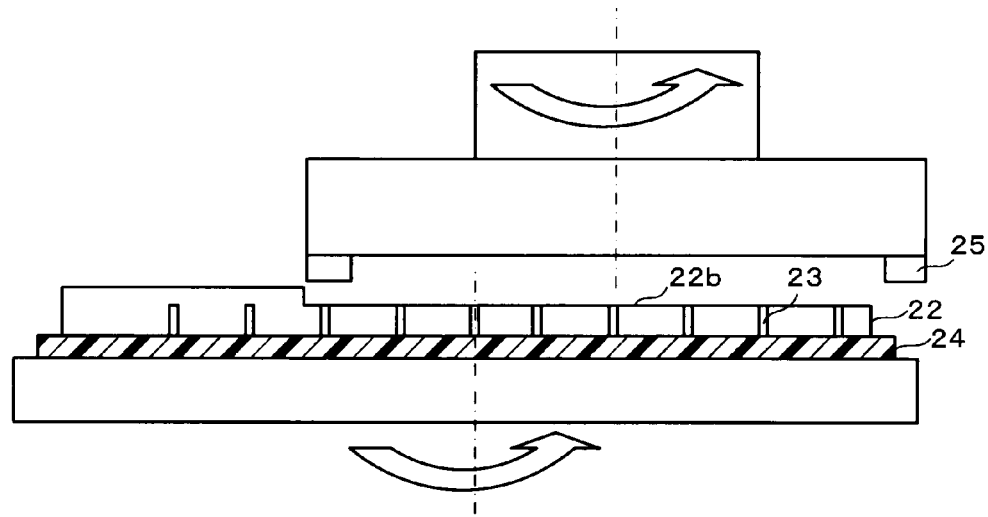

As shown in FIG. 3A, a dicing blade 21 is used to perform half dicing of a semiconductor wafer 22 along the dicing region. The half dicing is performed to form grooves 23 in the front surface (element formation surface) 22a of the semiconductor wafer 22 by the dicing blade 21 to have a depth of the grooves 23 falling in a thickness range of the semiconductor wafer 22. Subsequently, a protection tape 24 is pasted to the front surface 22a of the semiconductor wafer 22 which is provided with the grooves 23 as shown in FIG. 3B. Then, a back surface 22b of the semiconductor wafer 22 is ground with a grinding stone 25 as shown in FIG. 3C. The back surface is ground until grinding reaches from the front surface 22a of the semiconductor wafer 22 to the formed grooves 23. The back surface 22b of the semiconductor wafer 22 is polished with a buff or the like, if necessary.

Figure 4:
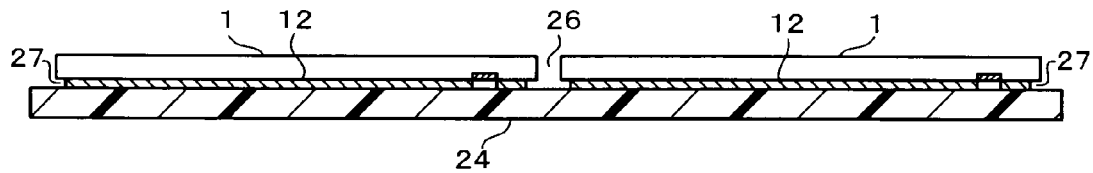
FIG. 4 is a cross sectional view showing a state after grinding the back surface of the semiconductor wafer.

Grinding (back surface grinding) is performed on the back surface 22b of the semiconductor wafer 22, in which the grooves 23 have been formed from the front surface 22a, so as to reach the grooves 23. Thus, plural element areas are singulated as the semiconductor elements 1. At this stage, since the plural semiconductor elements 1 are held by the protection tape 24, a wafer shape is maintained as a whole. This state is shown in FIG. 4. The protection tape 24 holds the front surfaces of the plural semiconductor elements 1. The adjacent semiconductor elements 1 have a space 26 corresponding to a width of each of the grooves 23 formed by half dicing between. Besides, there is also a space 27 between the front surface of the semiconductor element 1 and the protection tape 24 in correspondence with the portion where the insulating protection film 12 is not present.

Figure 5A:
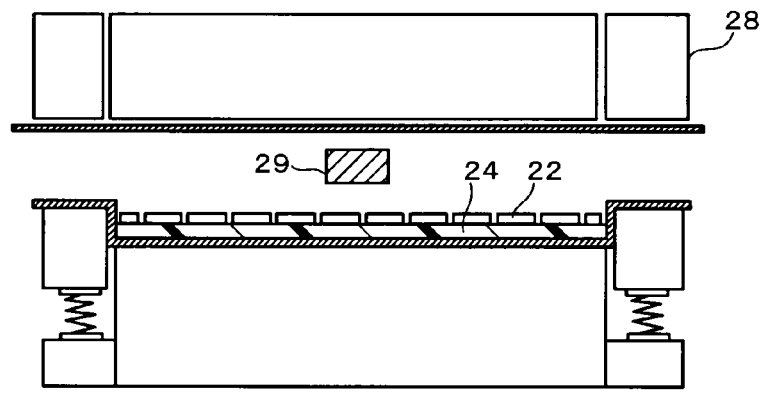
FIG. 5A and FIG. 5B are cross sectional views showing an insulating adhesive layer forming step in the production process of the semiconductor element shown in FIG. 1.

As shown in FIG. 5A, the plural semiconductor elements 1 which are held by the protection tape 24 to maintain the wafer shape are arranged in a mold 28 for forming the insulating adhesive layer 13. To form the insulating adhesive layer 13, mold forming such as compression molding (forming) is applied. The plural semiconductor elements 1 which are held in the wafer shape are placed with their back surfaces directed upward in the mold 28. To form the insulating adhesive layer 13, coating or the like of a liquid insulating adhesive agent can also be applied instead of the mold forming.

Figure 5B:
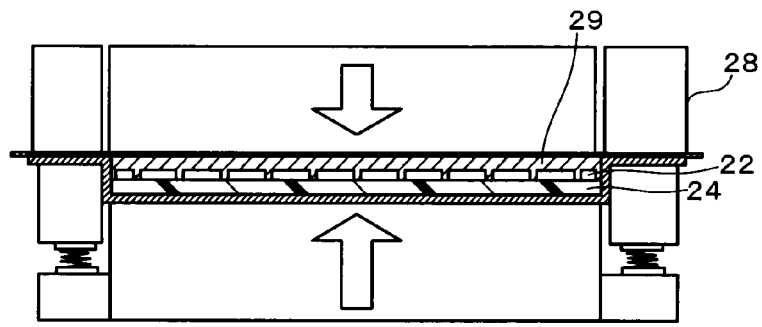

An insulating resin material 29 which is a material for forming the insulating adhesive layer 13 is charged into the mold 28 where the plural semiconductor elements 1 are arranged. The mold 28 is closed as shown in FIG. 5B, and a pressure and a temperature for the insulating resin material 29 are applied to perform molding. As the insulating resin material 29 which becomes the material for forming the insulating adhesive layer 13, a thermosetting insulating resin having adhesion properties such as an epoxy resin is used. If formability and adhesion properties are satisfied, a thermoplastic insulating resin such as an acrylic resin or an ultraviolet-setting type insulating resin may be used as the insulating resin material 29.

Figure 6:
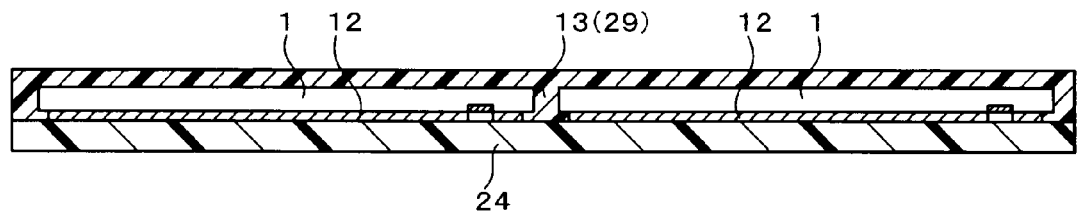
FIG. 6 is a cross sectional view showing a semiconductor wafer which is through the formation of the insulating adhesive layer.

The insulating resin material 29 to which a pressure and a temperature have been applied is formed into a layer shape to cover the back surfaces of the semiconductor elements 1 as shown in FIG. 6 and at the same time charged into the space 26 between the adjacent semiconductor elements 1 and the space 27 between the front surfaces of the semiconductor elements 1 and the protection tape 24. Thus, the prescribed surfaces of the plural semiconductor elements 1 which are held to have the wafer shape are coated (sealed) with the insulating resin material 29. Namely, the insulating adhesive layer 13 is formed to cover the back surfaces, sidewall surfaces, and the portions where the insulating protection film 12 is not formed in the front surfaces of the semiconductor elements 1.

When a thermosetting insulating resin is used as the insulating resin material 29, a thermosetting insulating resin layer in a semi-cured state (B stage) is formed such that the insulating adhesive layer 13 functions as an adhesive agent in a step of mounting on the circuit substrate. The insulating adhesive layer 13 in the stage of the semiconductor elements 1 has the thermosetting insulating resin layer in the semi-cured state. When the thermoplastic insulating resin is used as the insulating resin material 29, the insulating adhesive layer 13 of the semiconductor elements 1 has a thermoplastic insulating resin layer. When an ultraviolet-setting type insulating resin is used as the insulating resin material 29, the insulating adhesive agent 13 of the semiconductor elements 1 has an ultraviolet-setting type insulating resin layer in a state before setting.

Figure 7A:
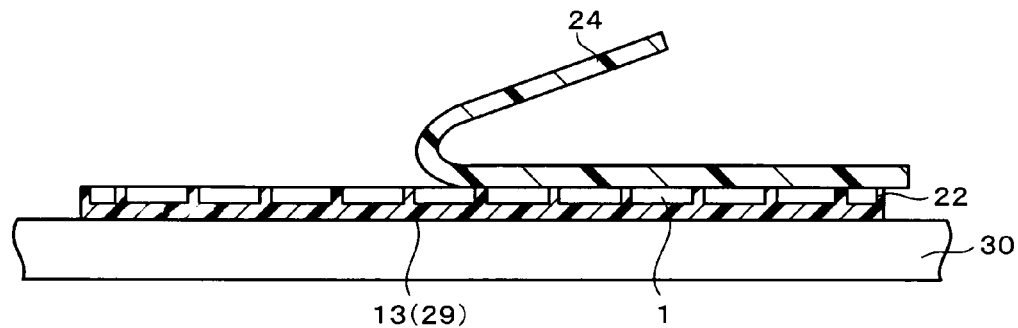
FIG. 7A and FIG. 7B are cross sectional views showing an insulating adhesive layer cutting step in the production process of the semiconductor element shown in FIG. 1.
Figure 7B:
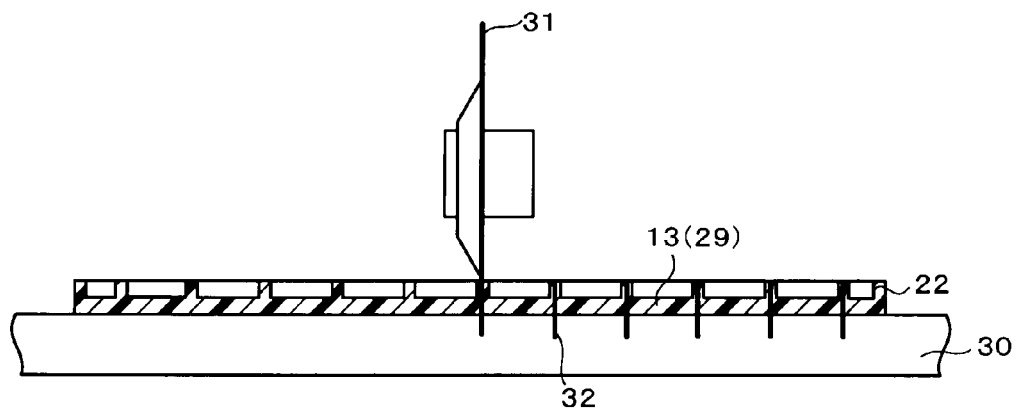

The plural semiconductor elements 1 held by the protection tape 24 are removed from the mold 28, and a dicing tape 30 is pasted to the plural semiconductor elements 1 as shown in FIG. 7A. The dicing tape 30 is pasted to the back surfaces of the semiconductor elements 1 which are covered with the insulating adhesive layer 13. After the plural semiconductor elements 1 are pasted to the dicing tape 30, the protection tape 24 is removed from the front surfaces. Then, the insulating adhesive layer 13 which is between the adjacent semiconductor elements 1 is cut with a blade 31 to singulate the plural semiconductor elements 1 as shown in FIG. 7B. In FIG. 7B, reference numeral 32 denotes the grooves cut with the blade 31.

Figure 8:
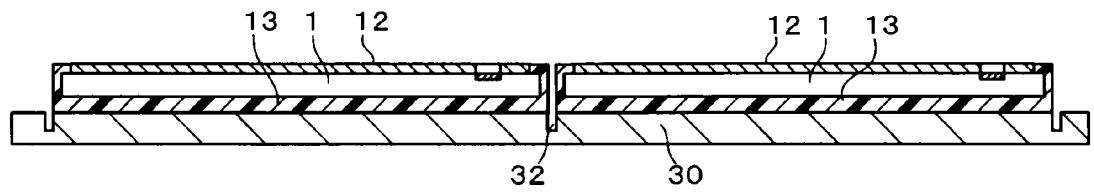
FIG. 8 is a cross sectional view showing the semiconductor wafer after cutting the insulating adhesive layer.

Thus, there are produced the semiconductor elements 1 that most (element area) of the front surfaces are coated with the insulating protection film 12, and the back surfaces, the sidewall surfaces and the portions (outer peripheral areas) not coated with the insulating protection film 12 in the front surfaces are covered with the insulating adhesive layer 13. Such a state is shown in FIG. 8. For the blade 31 for cutting the insulating adhesive layer 13, one having a blade thickness smaller than the dicing blade 21 is used. Thus, the sidewall surfaces of the semiconductor elements 1 can be maintained in a state covered with the insulating adhesive layer 13. The insulating adhesive layer 13 can also be cut by applying laser processing or the like.

Figure 9:
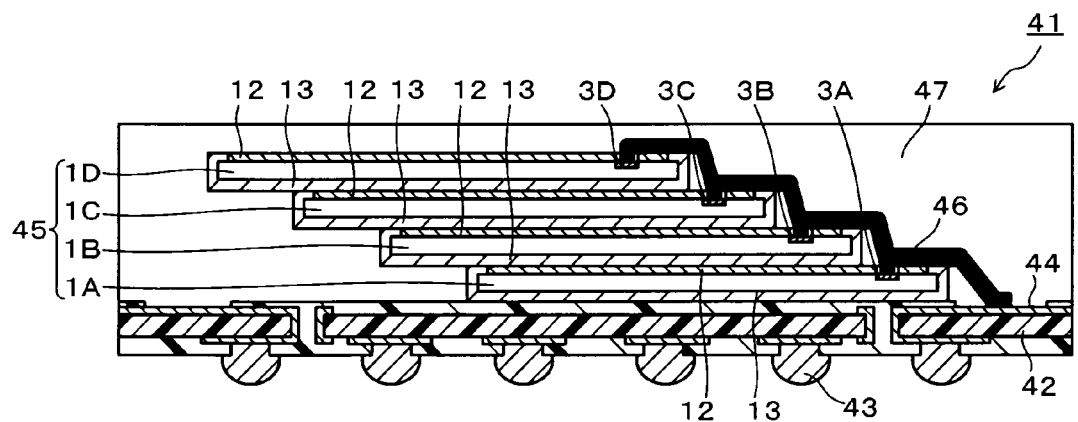
FIG. 9 is a cross sectional view showing a semiconductor device according to a first embodiment of the present invention.

A semiconductor device according to an embodiment of the present invention is described below with reference to FIG. 9 through FIG. 11. FIG. 9 shows a structure of a semiconductor device having a stacked multichip package structure according to a first embodiment. A semiconductor device (semiconductor package) 41 shown in FIG. 9 has wiring boards 42 as a circuit substrate for mounting the elements. The wiring board 42 may be one which can mount the semiconductor elements thereon and has wiring networks formed on the front surface and within it. The circuit substrate may be an integration of an element mounting section such as a lead frame and a circuit portion.

For the substrate configuring the wiring boards 42, a semiconductor substrate or an insulating substrate such as a resin substrate, a ceramics substrate or a glass substrate can be applied. Specific examples of the wiring boards 42 include a printed circuit board using a glass-epoxy resin, a BT resin (bismaleimide triazine resin) or the like. External connection terminals 43 are formed on the undersurfaces of the wiring boards 42. Since a BGA package is shown here, solder bumps are formed as the external connection terminals 43 on the undersurfaces of the wiring boards 42. The semiconductor device 41 is also applicable to an LGA package and the like, and metal lands are applied as the external connection terminals 43 in this case.

The element mounting section is provided on the top surfaces of the wiring boards 42, and connection pads 44, which are electrically connected to the external connection terminals 43 through the wiring networks, are provided on the peripheries of the wiring boards 42. The connection pads 44 become connection points at the time of wire bonding and connection points with the conductive layer. The plural semiconductor elements 1 are stacked on the element mounting sections of the wiring boards 42 to configure an element group (semiconductor element group) 45. FIG. 9 shows a state that four semiconductor elements 1A to 1D are stacked to have a step-like shape.

For the first through fourth semiconductor elements 1A to 1D, the semiconductor element 1 of the embodiment described above is applied, and the insulating adhesive layer 13 is formed on the back surface, the sidewall surface and portions (outer peripheral areas) where the insulating protection film 12 is not formed in the front surface. The first semiconductor element 1A is adhered on the element mounting section of the wiring board 42 via the insulating adhesive layer 13 which is on its back surface. The second semiconductor element 1B is adhered to the first semiconductor element 1A via the insulating adhesive layer 13 which is on its back surface. Similarly, the third and fourth semiconductor elements 1C, 1D are adhered to the semiconductor elements 1B, 1C which are on the lower layer via the insulating adhesive layer 13.

Specific examples of the first through fourth semiconductor elements 1A to 1D include a semiconductor memory element such as a NAND-type flash memory. If necessary, a controller element may be stacked on the semiconductor elements stacked into multiple layers, and specifically, the semiconductor element 1D of the top layer. The number of the semiconductor elements 1 configuring the element group 45 is not limited to four as far as it is two or more. The element group 45 may be configured of two, three or five or more semiconductor elements 1. The element group 45 may be a lamination of the memory elements and the controller element.

Electrode pads 3A to 3D which are formed on the first through fourth semiconductor elements 1A to 1D are arranged along one outline side (e.g., one long side) of the semiconductor elements 1A to 1D. In other words, the first through fourth semiconductor element 1A to 1D each have a one-side pad structure. The semiconductor elements 1A to 1D having the one-side pad structure are stacked in a step-like fashion to expose the electrode pads 3A to 3D. For example, when the semiconductor element 1 has a one long-side pad structure, the short sides of the first through fourth semiconductor elements 1A to 1D are aligned, and the long sides are displaced to expose the electrode pads 3A to 3D when stacked.

The electrode pads 3A to 3D of the first through fourth semiconductor elements 1A to 1D are electrically connected to the connection pads 44 of the wiring board 42 through metallic wires 46. When the electrode pads 3A to 3D have the same electric properties and signal characteristics, the electrode pads 3A to 3D of the stacked semiconductor elements 1A to 1D can be connected sequentially by the metallic wires 46. In such a case, the metallic wires 46 may be connected by separately performing the bonding process, or the electrode pads 3A to 3D may be connected sequentially by a single metallic wire 46.

The metallic wire 46 is connected by applying, for example, reverse bonding. In other words, unshown metal bumps are previously formed on the electrode pads 3. One ends of the metallic wires 46 are ball connected to the connection pads 44 of the wiring board 42, and the other ends are connected to the metal bumps formed on the electrode pads 3. The metallic wires 46 are preferably wired to come into contact with the insulating adhesive layers 13 formed on the front surfaces of the semiconductor elements 1A to 1D. The metallic wire 46 shown in FIG. 9 is contacted to the insulating adhesive layers 13 but not limited to such a manner. The metallic wire 46 may be wired while keeping the loop height.

The plural semiconductor elements 1A to 1D stacked on the wiring board 42 are sealed together with the metallic wire 46 by a sealing resin layer (sealing portion) 47. The semiconductor device 41 having the stacked multichip package structure is configured by these constituent elements. For the sealing resin layer 47, an epoxy resin or the like is used, and it is formed by transfer forming or the like.

Figure 10:
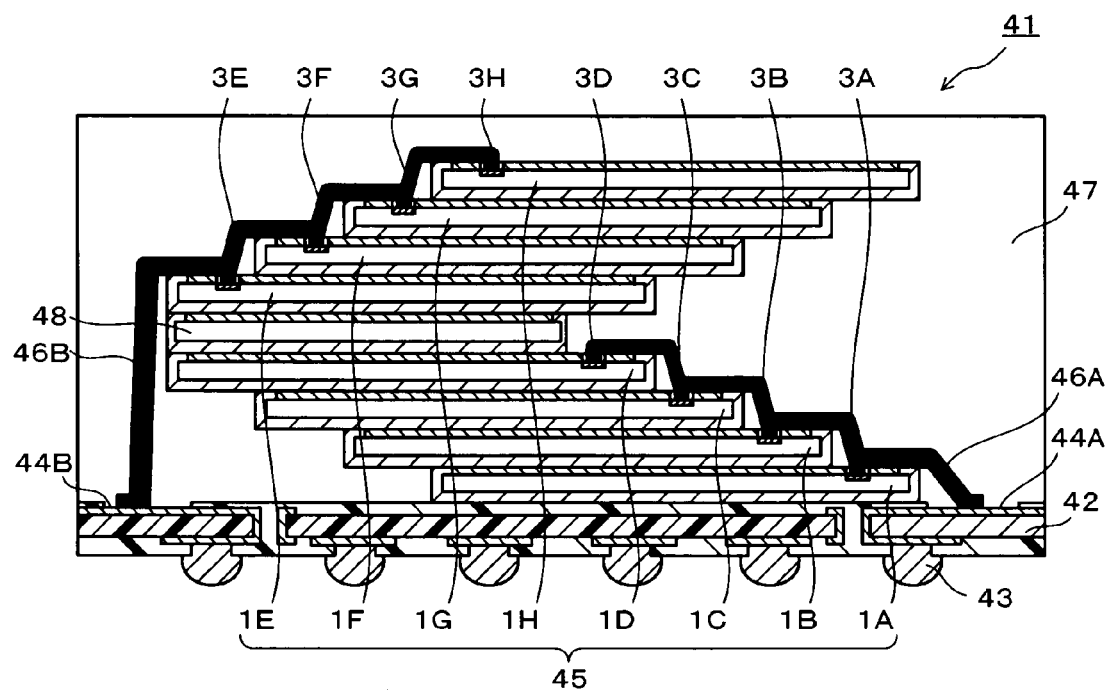
FIG. 10 is a cross sectional view showing a modified example of the semiconductor device shown in FIG. 9.

FIG. 10 shows the semiconductor device 41 which has an element group 45 which is comprised of eight semiconductor elements 1A to 1H. The semiconductor device 41 shown in FIG. 10 has a first element group having the first through fourth semiconductor elements 1A to 1D which are stacked on the wiring board 42, and a second element group having fifth through eighth semiconductor elements which are stacked thereon via a spacer 48. The first and second element groups are configured of the semiconductor elements 1 of the embodiment described above.

The first through fourth semiconductor elements 1A to 1D configuring the first element group are stacked to have a step-like shape on the wiring board 42 to expose electrode pads 3A to 3D. The fifth through eighth semiconductor elements 1E to 1H configuring the second element group are stacked to have a step-like shape in a direction opposite to the first through fourth semiconductor elements 1A to 1D so as to expose electrode pads 3E to 3H. The second element group is stacked on the first element group via the spacer 48. The spacer 48 can be omitted by displacing the fifth semiconductor element 1E to expose the electrode pad 3D of the fourth semiconductor element 1D.

In this case, the first semiconductor element 1A is adhered to the element mounting section of the wiring board 42 via the insulating adhesive layer 13 which is on its back surface in the same manner as in FIG. 9. The second through fourth semiconductor elements 1B to 1D are adhered to the semiconductor elements 1 on the lower layers via the insulating adhesive layers 13 which are on their back surfaces. The fourth semiconductor element 1E is adhered to the spacer 48 via the insulating adhesive layer 13 which is on its back surface. The fifth through eighth semiconductor elements 1E to 1H are adhered to the semiconductor elements 1 which are on the lower layers via the insulating adhesive layer 13 which is on their back surfaces.

The electrode pads 3A to 3D of the first through fourth semiconductor elements 1A to 1D are connected to a first connection pad 44A via a first metallic wire 46A. The electrode pads 3E to 3H of the fifth through eighth semiconductor elements 1E to 1H are connected to a second connection pad 44B via a second metallic wire 46B. Among the electrode pads 3A to 3D of the first through fourth semiconductor elements 1A to 1D, the electrode pads 3A to 3D having the same electric properties and signal characteristics are sequentially connected by the first metallic wire 46A. The fifth through eighth semiconductor elements 1E to 1H are also the same, and the electrode pads 3E to 3H having the same electric properties and signal characteristics are sequentially connected by the second metallic wire 46B.

In the semiconductor device 41 of this embodiment, the semiconductor elements 1 have not only the back surface but also the sidewall surface and the outer peripheral area of front surface covered with the insulating adhesive layer 13. Therefore, it is necessary to keep the loop height of the metallic wire 46 not to contact with the corners of the semiconductor elements 1. Therefore, the loop height of the metallic wire 46 can be decreased as low as possible. For example, the metallic wire 46 can be contacted to the insulating protection film 12 and the insulating adhesive layer 13 which are on the front surfaces of the semiconductor elements 1.

The loop height of the metallic wire 46 connected to the semiconductor element 1 (the fourth semiconductor element 1D in FIG. 9 or the eighth semiconductor element 1H in FIG. 10) positioned on the top affects on the thickness of the sealing resin layer 47 and therefore on the thickness of the semiconductor device 41. In this embodiment, since the loop height of the metallic wire 46 can be decreased as low as possible, it becomes possible to decrease the thickness of the semiconductor device 41. In other words, it is possible to realize the semiconductor device 41 which is configured by stacking the plural semiconductor elements 1 and produced small and thin in size with high yield and high reliability.

Besides, wire sweeping due to a resin flow when the sealing resin layer 47 is formed by applying a transfer forming or the like can be prevented by contacting the metallic wire 46 to the insulating protection film 12 and the insulating adhesive layer 13 which are on the front surface of the semiconductor element 1. It is because when the metallic wire 46 is contacted to the insulating protection film 12 and the insulating adhesive layer 13, a resistance force against the resin flow is improved, and a rise-up portion of the metallic wire 46 becomes hard to fall. And, an occurrence of a short circuit due to a contact between different potential wires can be suppressed from occurring by preventing the wire sweep of the metallic wire 46. Therefore, the production yield and reliability of the semiconductor device 41 having a laminated structure can be further enhanced.

The semiconductor devices 41 shown in FIG. 9 and FIG. 10 have the metallic wire 46 as the connection member which electrically connects between the electrode pads 3 of the plural semiconductor elements 1 and the connection pad 44. The connection member is not limited to the above. The surfaces of the semiconductor elements 1 are covered with the insulating protection film 12 and the insulating adhesive layer 13, and the sidewall surface is also covered with the insulating adhesive layer 13, so that a coated layer of a conductive material can be formed between the electrode pads 3 and the connection pad 44. The connection member may be the coated layer (conductive layer) of the conductive material.

For example, the conductive layer is formed by coating a conductive paste (or conductive coating), which has fine particles of a conductive material dispersed into a solvent or a binder, depending on a desired pattern. As the fine particles of the conductive material, fine gold particles or fine silver particles are used. The conductive paste is coated by discharging from, for example, an ink jet head. Otherwise, the conductive paste may be coated by applying a printing method using a mask, such as a screen printing method. According to the ink jet method, the conductive layer having a fine pattern can be formed with a good reproducibility. The conductive layer may be a coated layer of a conductive resin. The height of the connection member can be further decreased by applying the conductive layer to the connection member. Therefore, it is possible to realize the semiconductor device 41 which is produced small and thin in size with high yield and high reliability.

Figure 11A:
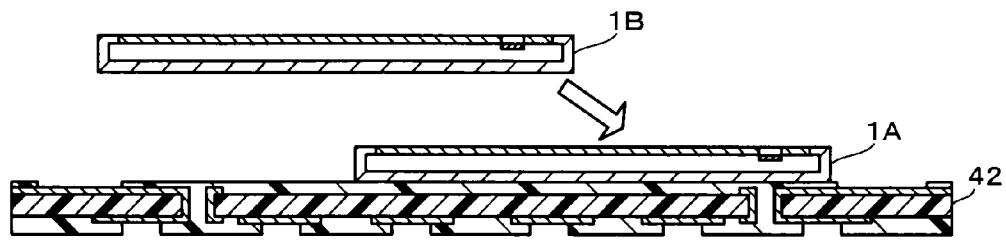
FIG. 11A through FIG. 11C are cross sectional views showing a production process of the semiconductor device shown in FIG. 9.
Figure 11B:
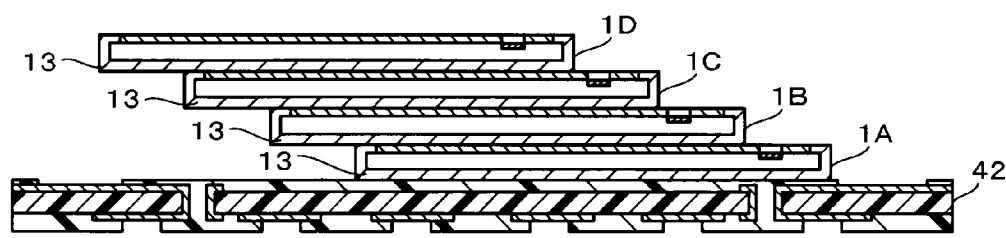
Figure 11C:
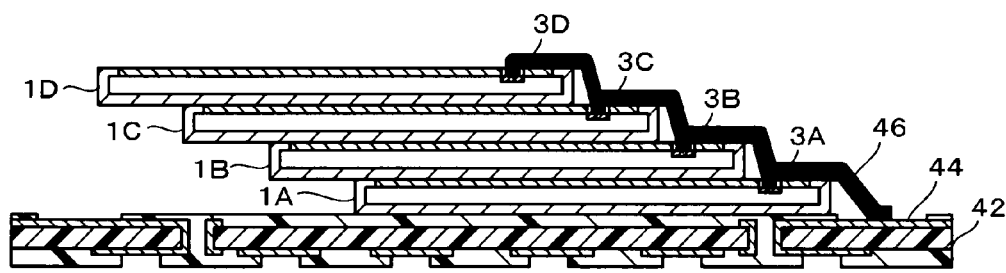

For example, the semiconductor device 41 of the embodiment described above is produced as follows. First, as shown in FIG. 11A, the first semiconductor element 1A is arranged on the wiring board 42, and the second semiconductor element 1B is further arranged on it to have a step-like shape. Similarly, the third and fourth semiconductor elements 1C, 1D are sequentially arranged on the second semiconductor element 1B. Then, a stacked body having the first through fourth semiconductor elements 1A to 1D stacked on the wiring board 42 as shown in FIG. 11B is heated to adhere between the wiring board 42 and the first semiconductor element 1A and between the individual semiconductor elements 1.

The adhesion between the wiring board 42 and the first semiconductor element 1A and between the individual semiconductor elements 1 is performed by the insulating adhesive layers 13 formed on the back surfaces of the semiconductor elements 1. When a semi-cured thermosetting insulating resin is applied for the insulating adhesive layer 13, the adhered insulating adhesive layer 13 becomes an insulating resin layer in a cured state (C stage). In the stage of producing the semiconductor device 41, the semiconductor element 1 is adhered to the wiring board 42 or its adjacent semiconductor element 1 via the insulating resin layer (insulating adhesive layer) 13 in the cured state (C stage).

As shown in FIG. 1C, the connection pad 44 of the wiring board 42 and the electrode pads 3A to 3D of the semiconductor elements 1A to 1D are electrically connected by the metallic wire 46. Where a conductive layer is used as the connection member, the conductive material (conductive paste or conductive coating) is coated on the front surface and sidewall surface of the semiconductor element 1 and also on the front surface of the wiring board 42 so as to electrically connect the connection pad 44 of the wiring board 42 and the electrode pads 3A to 3D of the semiconductor elements 1A to 1D. Subsequently, the resin sealing process and the external connection terminals forming process are performed to produce the semiconductor device 41.

Figure 12:
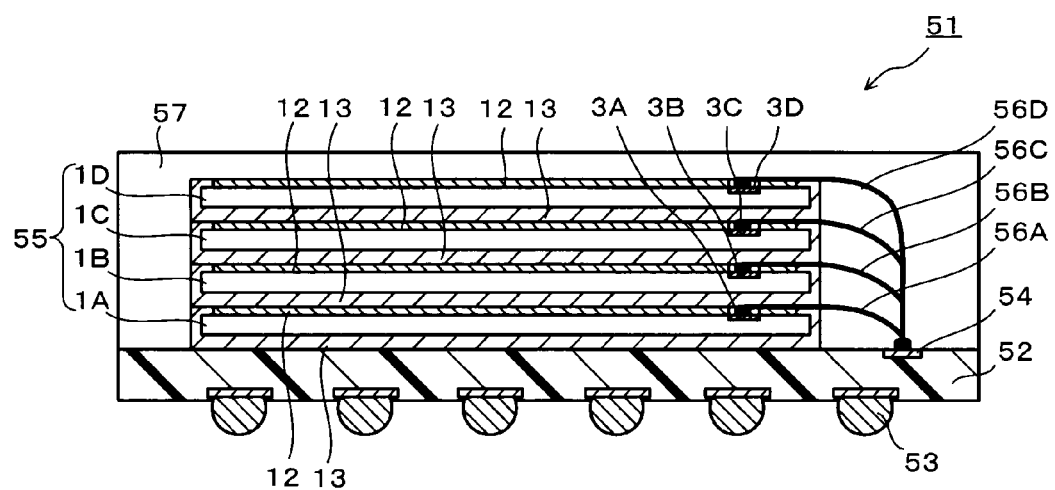
FIG. 12 is a cross sectional view showing a semiconductor device according to a second embodiment of the present invention.

A semiconductor device according to a second embodiment of the present invention is described below with reference to FIG. 12 and FIG. 13. FIG. 12 shows a structure of the semiconductor device (semiconductor package) according to the second embodiment. A semiconductor device 51 shown in FIG. 12 has a wiring board 52 as a circuit substrate in the same manner as in the first embodiment. The wiring board 52 has the same structure as in the first embodiment. Solder bumps are formed as external connection terminals 53 on the undersurface of the wiring board 52.

An element mounting section is provided on the top surface of the wiring board 52, and connection pads 54 are provided around it and electrically connected to the external connection terminals 53 through wiring networks. The plural semiconductor elements 1 are stacked on the element mounting section of the wiring board 52 to form an element group 55. FIG. 12 shows a state that four semiconductor elements 1A to 1D are stacked, but the number of stacked semiconductor elements 1 is not limited to four and may be any if plural (two or more).

The first through fourth semiconductor elements 1A to 1D are formed to have the same rectangular shape and stacked with the long and short sides aligned. The first through fourth semiconductor elements 1A to 1D are stacked with their respective sides aligned such that an element occupied area with respect to the wiring board 52 is minimized. Specific examples of the semiconductor elements 1A to 1D include a semiconductor memory element such as a NAND-type flash memory as in the first embodiment. A controller element may be stacked on the semiconductor memory elements which are stacked into multiple layers, if necessary.

The electrode pads 3A to 3D of the first through fourth semiconductor elements 1A to 1D are electrically connected to the connection pads 54 of the wiring board 52 through first through fourth metallic wires 56A to 56D. For the metallic wires 56, general Au wires or Cu wires are used. To connect the metallic wires 56, it is preferable to apply reverse bonding capable of lowering the loop height. One ends of the metallic wires 56 are ball connected to the connection pads 54. The other ends of the metallic wires 56 are connected to the metal bumps which are previously formed on the electrode pads 3.

Since the first through fourth semiconductor elements 1A to 1D are stacked with the individual sides aligned, the upper side semiconductor element 1 interferes with the first through third metallic wires 56A, 56B, 56C which are connected to the first through third semiconductor elements 1A, 1B, 1C. Accordingly, an end (element-side end) of the first metallic wire 56A connected to the electrode pad 3A of the lower side first semiconductor element 1A is buried into the insulating adhesive layer 13 of the upper side second semiconductor element 1B. Similarly, the element-side ends of the second and third metallic wires 56B, 56C located at the lower side are buried into the insulating adhesive layer 13 of the respective upper side third and fourth semiconductor elements 1C, 1D.

The insulating adhesive layers 13 of the second through fourth semiconductor elements 1B, 1C, 1D, into which the element side ends of the first through third metallic wires 56A, 56B, 56C are buried, also have a function as the spacer layer. Similar to the first embodiment described above, the height of the metallic wire 56 can be decreased as low as possible by routing the metallic wire 56 on the front surface of the semiconductor element 1. Thus, the thickness required for burying the metallic wires 56A, 56B, 56C connected to the first through third semiconductor elements 1A, 1B, 1C can be decreased. For the metallic wire 56D connected to the top fourth semiconductor element 1D, the resin sealing thickness can be decreased.

The thickness of the insulating adhesive layer 13, which functions as the spacer layer, can be made smaller in comparison with the case of burying the metallic wire of a conventional device requiring the holding of the loop height. Specifically, the thickness of the insulating adhesive layer 13, which functions as the spacer layer, can be decreased to 60 μm or less. But, if the thickness is excessively decreased, the function as the spacer layer is lowered, and it is preferable that the thickness of the insulating adhesive layer 13 is 30 μm or more. Besides, the thickness of a sealing resin layer 57 which seals the first through fourth semiconductor elements 1A to 1D together with the metallic wires 56A to 56D can be decreased. Therefore, it is possible to realize the semiconductor device 51 which has the plural semiconductor elements 1 mounted by stacking and is produced small and thin in size with high yield and high reliability.

Figure 13A:
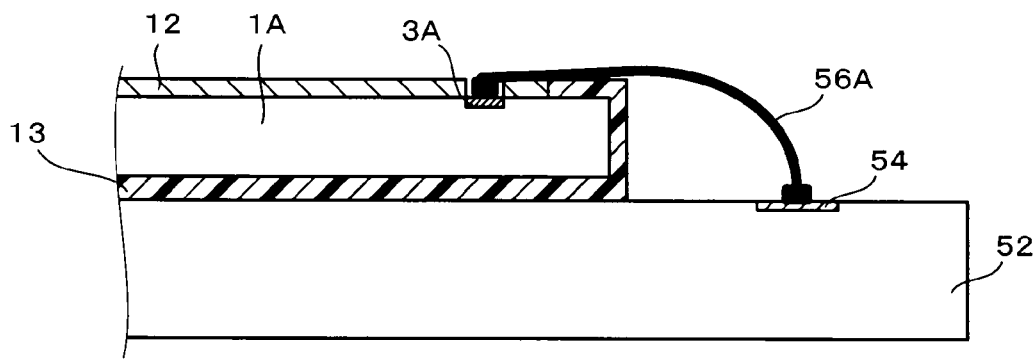
FIG. 13A and FIG. 13B are cross sectional views showing a production process of the semiconductor device shown in FIG. 12.
Figure 13B:
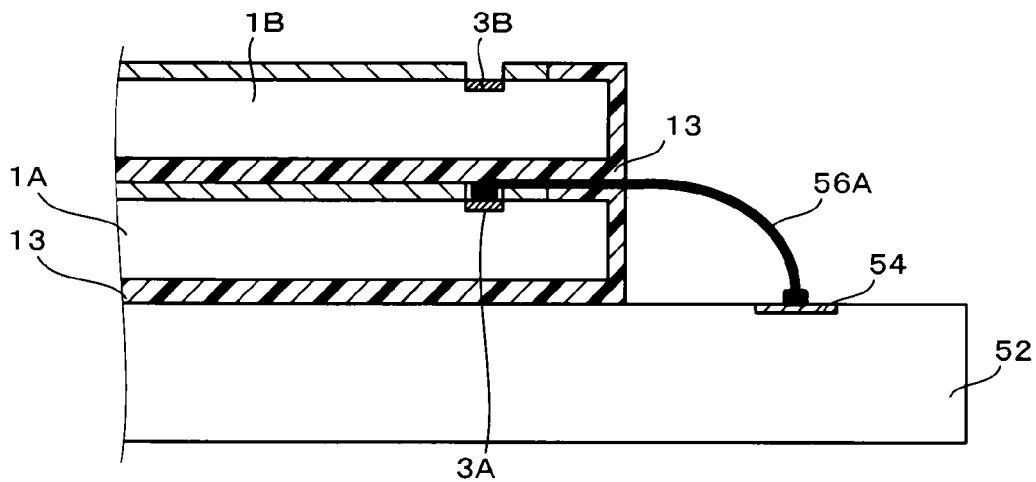

For example, the semiconductor device 51 of this embodiment is produced as follows. First, the first semiconductor element 1A is adhered to the wiring board 52 as shown in FIG. 13A. The first semiconductor element 1A is adhered to the wiring board 52 via the insulating adhesive layer 13 provided on its undersurface. Subsequently, the connection pads 54 of the wiring board 52 and the electrode pads 3A of the first semiconductor element 1A are electrically connected by the first metallic wires 56A. Then, the second semiconductor element 1B is adhered to the first semiconductor element 1A as shown in FIG. 13B. The second semiconductor element 1B is adhered to the first semiconductor element 1A via the insulating adhesive layer 13 which is formed on its undersurface.

At this time, the element-side end of the first metallic wire 56A connected to the first semiconductor element 1A is buried into the insulating adhesive layer 13 of the second semiconductor element 1B softened or melted at the time of an adhering process. The first metallic wire 56A is buried into the insulating adhesive layer 13 of the second semiconductor element 1B while contacting to the front surface of the first semiconductor element 1A by a pressure when the second semiconductor element 1B is adhered. Similarly, the second metallic wire 56B, the third and fourth semiconductor elements 1C, 1D, and the third and fourth metallic wires 56C, 56D are connected. Subsequently, the resin sealing process and the external connection terminals forming process are performed to produce the semiconductor device 51 which is small and thin in size and excellent in reliability.

Figure 14:
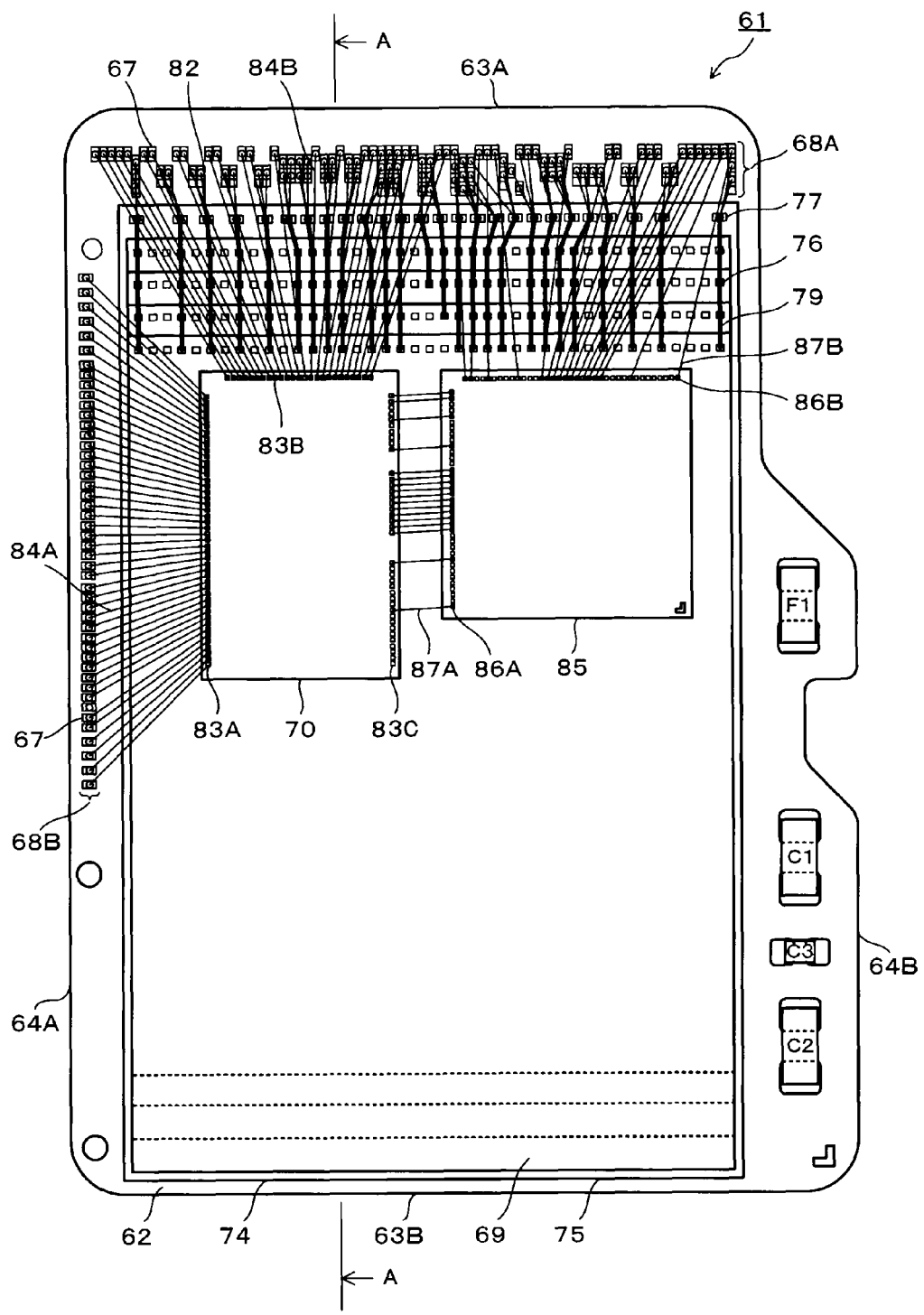
FIG. 14 is a plan view showing a semiconductor device according to a third embodiment of the present invention.
Figure 15:
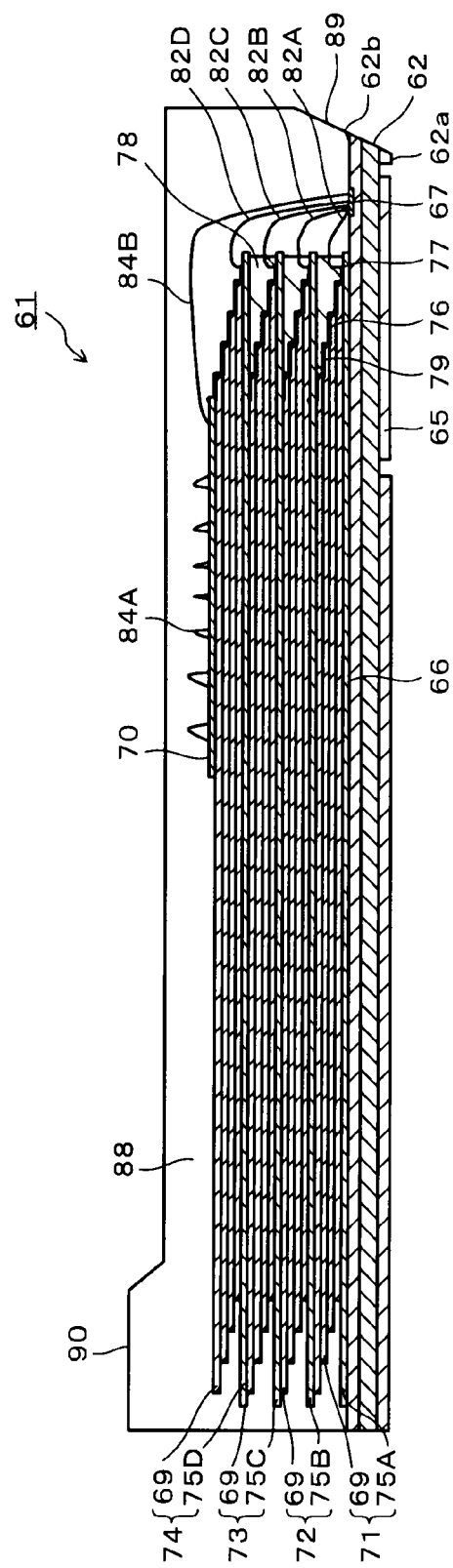
FIG. 15 is a cross sectional view taken along line A-A of FIG. 14.

Then, a semiconductor device according to a third embodiment of the present invention is described with reference to FIG. 14 and FIG. 15. FIG. 14 and FIG. 15 are diagrams showing a structure of a semiconductor memory device (semiconductor device) according to the third embodiment. FIG. 14 is a plan view of the semiconductor memory device, and FIG. 15 is a cross sectional view (a cross sectional view taken in a direction of the long side) taken along line A-A. A semiconductor memory device 61 shown in the drawings configures a semiconductor memory card, and the semiconductor memory device 61 is solely used as a memory card (micro SD card) of the SD™ standard.

The semiconductor memory device 61 has a wiring board 62 which serves as an element-mounting substrate and a terminal-forming substrate. For example, the wiring board 62 has wiring networks provided within and on the front surface of an insulating resin substrate, and specifically a printed circuit board using a glass-epoxy resin, a BT resin (bismaleimide triazine resin) or the like is applied. The wiring board 62 has a first main surface 62a which becomes a terminal formation surface and a second main surface 62b which becomes an element-mounted surface.

The wiring board 62 has a substantially rectangular profile. One short side 63A of the wiring board 62 corresponds to a leading end of a memory card when it is inserted into a card slot. The other short side 63B corresponds to the rear end part of the memory card. One long side 64A of the wiring board 62 has a linear shape, and the other long side 64B has a cutout portion and a recess portion to indicate the forward and backward direction and the front and rear surface direction of the memory card. Each corner of the wiring board 62 has a curved shape.

An external connection terminal 65 which becomes an input/output terminal of the memory card is formed on the first main surface 62a of the wiring board 62. The external connection terminal 65 is formed of a metal layer which is formed by electrolytic plating or the like. The first main surface 62a of the wiring board 62 corresponds to the front surface of the memory card. Besides, a first wiring network (not shown) is provided in a region on the first main surface 62a of the wiring board 62 excepting a region where the external connection terminal 65 is formed. The first wiring network has, for example, test pads of the memory card. The first wiring network provided on the first main surface 62a are covered with an insulating layer (not shown) using an insulating adhesive seal or adhesive tape.

The second main surface 62b of the wiring board 62 has an element mounting section 66 and a second wiring network including connection pads 67. The second main surface 62b of the wiring board 62 corresponds to the back surface of the memory card. The second wiring network having the connection pads 67 is electrically connected to the external connection terminal 65 and the first wiring network through unshown internal wiring (through holes etc.) of the wiring board 62. The connection pads 67 are arranged on a first pad region 68A along the short side 63A and a second pad region 68B along the long side 64A.

Plural memory elements (semiconductor elements) 69 are mounted on the element mounting section 66 of the wiring board 62. As the memory elements 69, semiconductor memory elements such as a NAND-type flash memory are used. A controller element (semiconductor element) 70 is stacked on the memory elements 69. The controller element 70 selects (chip selects) a memory element which writes and reads data to and from the plural memory elements 69, writes data into the selected memory element 69, or reads data which is stored in the selected memory element 69.

The plural memory elements 69 are divided into first through fourth element groups (memory element groups) 71, 72, 73, 74, and the element groups 71 to 74 are stacked on the first main surface 62a of the wiring board 62. The individual element groups 71 to 74 are configured of the four memory elements 69 and one relay element 75. The first element group 71 has a first relay element 75A which is arranged on the element mounting section 66 of the wiring board 62, and the four memory elements 69 configuring the first element group 71 are stacked sequentially to have a step-like shape on the first relay element 75A.

The memory elements 69 have the same rectangular shape and are provided with electrode pads 76. The electrode pads 76 are arranged on one side of the contour of the memory element 69, specifically along one short side. The memory elements 69 have a one short-side pad structure. Similarly, the relay element 75 has relay pads 77 which are arranged along one side (specifically one short side) of its contour and has a rectangular contour which is slightly larger than the memory element 69. As the relay element 75, a relay semiconductor element (Si interposer) not having an element structure is used. It is produced by the same process as an ordinary semiconductor element (Si element).

The first relay element 75A has its electrode formation surface, on which the relay pads 77 are formed, directed upward and is adhered onto the element mounting section 66 of the wiring board 62 via an adhesive layer (not shown). For the adhesive layer, a die attach film (adhesive agent film) which is mainly composed of a general polyimide resin, epoxy resin, acrylic resin or the like is used. The same is also applied to the adhesive layer of the memory elements 69. The first relay element 75A is arranged with a pad arrangement side (one short side) directed toward the short side 63A of the wiring board 62. The first relay element 75A is arranged to position the relay pads 77 near the first pad region 68A of the wiring board 62.

Among the four memory elements 69 configuring the first element group 71, the lowermost memory element 69 is adhered onto the first relay element 75A via an adhesive layer (unshown) with the electrode formation surface, on which the electrode pads 76 are formed, directed upward and the short sides displaced in the direction of the long sides so as to expose the relay pads 77. Similarly, the remaining three memory elements 69 are sequentially adhered onto the lowermost memory element 69 via the adhesive layer (not shown) with the short sides displaced in the direction of the long sides so as to expose the electrode pads 76 of the lower memory elements 69.

The four memory elements 69 are sequentially stacked on the first relay element 75A to have a step-like shape with the first relay element 75A and the pad arrangement side directed to the same direction, the long sides aligned, and the short sides displaced in the direction of the long sides so as to expose the relay pads 77 and the electrode pads 76 of the lower memory element 69. In other words, the first relay element 75A and the four memory elements 69 are stacked in a step-like fashion to expose the relay pads 77 and the electrode pads 76. Therefore, the relay pads 77 of the first relay element 75A and the electrode pads 76 of the four memory elements 69 are positioned near the first pad region 68A in a state exposed upward.

The second through fourth element groups 72 to 74 are sequentially stacked on the first element group 71. The second through fourth element groups 72 to 74 each have the same structure as the first element group 71. The second element group 72 has the second relay element 75B which is adhered onto the top memory element 69 of the first element group 71 via an adhesive layer (not shown) and the four memory elements 69 which are stacked to have a step-like shape on it. The four memory elements 69 configuring the second element group 72 have the same structure as that of the memory elements 69 configuring the first element group 71. The second relay element 75B also has the same structure as that of the first relay element 75A. The same is also applied to the memory elements 69 and relay elements 75C, 75D configuring the third and fourth element groups 73, 74.

The second relay element 75B and the four memory elements 69 configuring the second element group 72 are stacked in a step-like shape with the short sides displaced in the long side direction so as to direct the respective pad arrangement sides in the same direction, to align the long side directions and to expose the relay pads 77 and the electrode pads 76 of the lower memory element 69. The second element group 72 which is stacked with the stepped direction directed in the same direction as the first element group 71. Therefore, the relay pads 77 of the second relay element 75B and the electrode pads 76 of the four memory elements 69 are positioned in a state exposed upward near the first pad region 68A in the same manner as the first element group 71.

Similarly, the third element group 73 is configured of the third relay element 75C and the four memory elements 69 which are arranged on the second element group 72. The fourth element group 74 is configured of the fourth relay element 75D and the four memory elements 69 which are arranged on the third element group 73. The third and fourth relay elements 75C, 75D are adhered onto the top memory elements 69 of the lower element groups 72, 73 via an adhesive layer (not shown). The relay elements 75C, 75D and the four memory elements 69 configuring the third and fourth element groups 73, 74 are stacked in a step-like fashion in the same direction as the stepped direction of the first element group 71 with the pad arrangement sides directed in the same direction and to expose the relay pads 77 and electrode pads 76 of the lower memory element 69.

The second through fourth element groups 72 to 74 are stacked on the first element group 71 to have the step-like shape with the element arrangement and the laminated structure aligned. The first through fourth element groups 71 to 74 are configured to have the same stepped direction, element arrangement and laminated structure. Therefore, the occupied area of the relay elements 75 and the memory elements 69 to the wiring board 62 is suppressed from increasing with the relay pads 77 and the electrode pads 76 exposed. In other words, since the projected areas of the respective element groups 71 to 74 to the wiring board 62 are the same, the element occupied area of the semiconductor memory device 61 becomes an occupied area (actually an area of the relay element 75) of one element group. Therefore, the semiconductor memory device 61 having the plural memory elements 69 can be made compact.

The second through fourth relay elements 75B to 75D which configure the second through fourth element groups 72 to 74 are arranged to protrude from the lower element groups 71 to 73. The second through fourth relay elements 75B to 75D have an overhang structure. The relay pads 77 of the second through fourth relay elements 75B to 75D have a hollow state below them. If the state is as it is, there is a possibility of deteriorating the wire bonding properties of the second through fourth relay elements 75B to 75D with respect to the relay pads 77.

Accordingly, an insulating resin 78 is filled into the portions (hollow portions) below the overhang portions of the second through fourth relay elements 75B to 75D. The insulating resin 78 is filled to cover the step section of the first element group 71 between the first relay element 75A and the second relay element 75B. The same is also applied to the third and fourth relay elements 75C to 75D. For the insulating resin 78, a thermosetting resin such as an epoxy resin, a polyimide resin, a silicone resin or the like is used. The insulating resin 78 is formed by arranging the element groups 71 to 74 on the wiring board 62, charging a liquid resin and curing it. First, the element group 71 is arranged on the wiring board 62 and is connected. Second, the element group 72 is arranged on the element group 71, and the liquid resin is filled in the lower part of the element group 72 and is cured. Next, the element group 72 is connected. The element groups 73 to 74 are also the same. For example, the liquid resin is filled by a dispenser.

Figure 16:
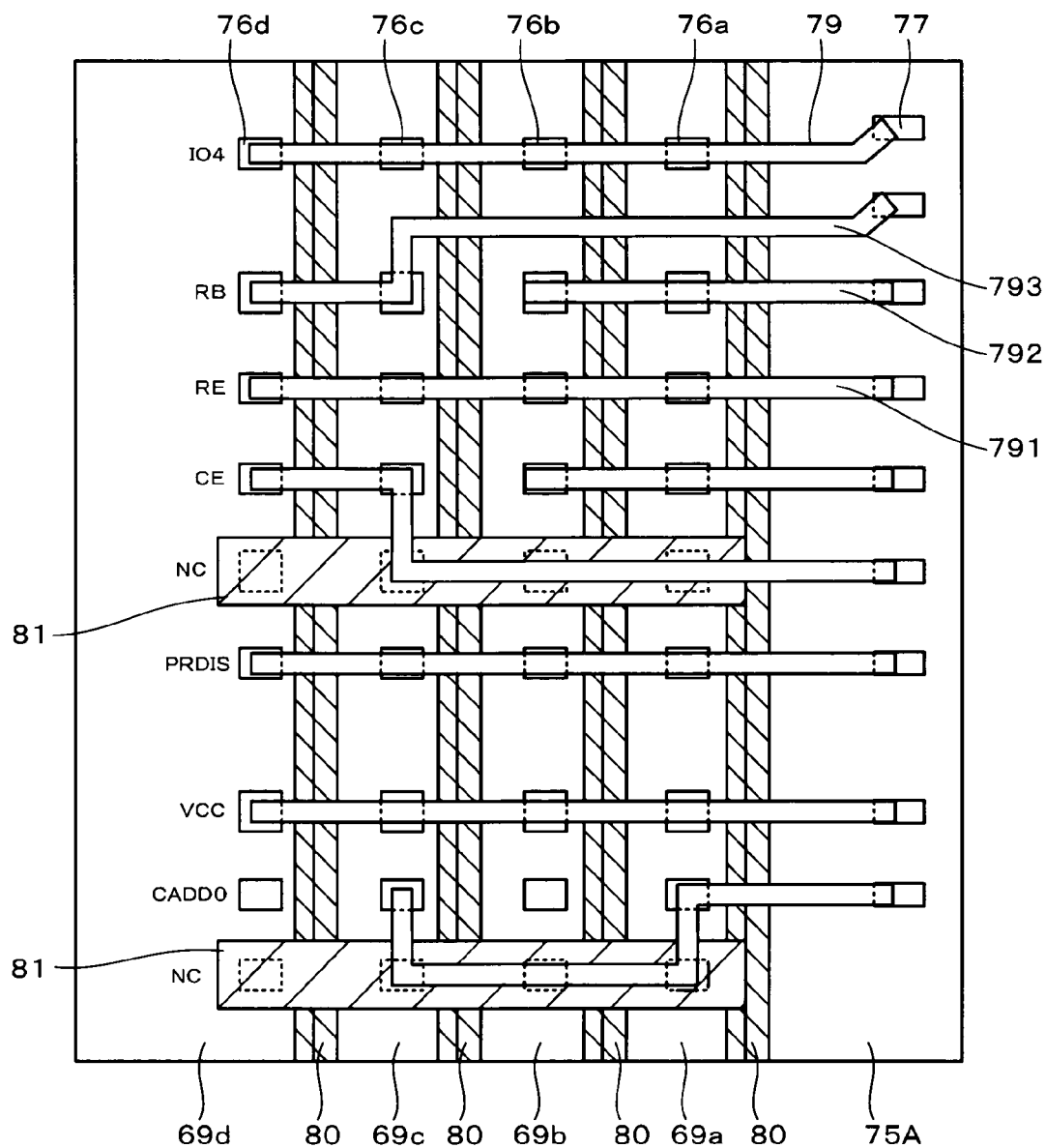
FIG. 16 is a plan view showing a connection structure between the electrode pads of plural semiconductor elements of the semiconductor device shown in FIG. 14.
Figure 17:
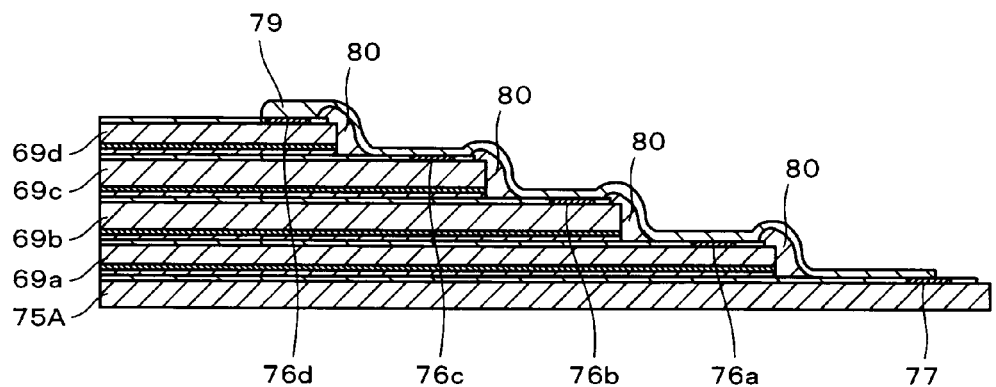
FIG. 17 is a cross sectional view corresponding to the plan view of FIG. 16.

The electrode pads 76 of the four memory elements 69 configuring the element groups 71 to 74 are electrically connected by a conductive layer 79 as shown in FIG. 16 and FIG. 17. The electrode pads 76 of the memory elements 69 and the relay pads 77 of the relay element 75 are also connected electrically by the conductive layer 79. Since the individual element groups 71 to 74 have a similar connection structure, the connection structure of the first element group 71 is shown as a typical example in FIG. 16 and FIG. 17. They show a state that the four memory elements 69, namely the first through fourth memory elements 69a to 69d having the first through fourth electrode pads 76a to 76d are stacked to have a step-like shape on the first relay element 75A configuring the first element group 71.

The conductive layer 79 is formed on the exposed surface corresponding to the step surface of the step section via the sidewall surface corresponding to the stepped portion of the step section of the first through fourth memory elements 69a to 69d. The conductive layer 79 is formed by coating, for example, a conductive paste (or conductive coating), which has fine particles of a conductive material dispersed into a solvent or a binder, depending on a desired pattern. For the fine particles of the conductive material, fine gold particles, fine silver particles or the like are used. For example, the conductive paste is coated by discharging from an ink jet head. Otherwise, the conductive paste may be coated by applying a printing method using a mask such as a screen printing method or the like. A conductive layer 79 having a fine pattern can be formed with a good reproducibility by an ink jet method.

Generally, the sidewall surface corresponding to the stepped portion of the step section of the memory elements 69a to 69d often exposes a semiconductor substrate (Si substrate or the like). Therefore, the sidewall surfaces of the individual memory elements 69a to 69d are covered with first insulating layers 80. The memory elements 69 can be configured of the semiconductor element 1 of the embodiment described above. And, since the outer peripheral area of the sidewall surface and front surface of the semiconductor element (memory element) 1 is covered with the insulating adhesive layer, the formation of the first insulating layers 80 can be omitted.

The conductive layer 79 is formed on the first insulating layers 80. Therefore, the first insulating layers 80 preferably have a slope shape. Thus, formability of the conductive layer 79 can be enhanced, and occurrence of a wire breakage or the like on the first insulating layers 80 can be suppressed. The first insulating layers 80 are formed by coating an insulating paste (or an insulating coating) by applying an ink jet method, a printing method using a mask or the like in the same manner as the conductive layer 79. Otherwise, it may be formed by coating an insulating liquid resin.

In a case where the electrode pads 76a to 76d of the first through fourth memory elements 69a to 69d have the same electric properties and signal characteristics, the first through fourth electrode pads 76a to 76d and the relay pad 77 can be connected sequentially by linearly forming the conductive layer 79 on the step sections of the first through fourth memory elements 69a to 69d and the relay element 75A.

Among the electrode pads 76 of the first through fourth memory elements 69a to 69d, the first through fourth electrode pads 76a to 76d are sequentially connected by a linear conductive layer 791 for a data signal terminal (IO), a voltage terminal (Vcc) and the like.

It is necessary to electrically connect terminals (such as CE, RB) for control signals such as element selection (chip select) to the connection pads 67 (here the relay pads 77 of the relay element 75A) of the wiring board 62 according to the control signals for each of the electrode pads 76a to 76d of the individual memory elements 69a to 69d. For example, for the CE terminal and the RB terminal, the electrode pads 76a, 76b of the first and second memory elements 69a, 69b and the electrode pads 76c, 76d of the third and fourth memory elements 69c, 69d are separately connected electrically to the connection pads 67 (here, the relay pads 77 of the relay element 75A) of the wiring board 62.

In such a case, the first through fourth electrode pads 76a to 76d cannot be connected sequentially by the linear conductive layer 79. Besides, they cannot be connected directly because there are the first and second electrode pads 76a, 76b between the third and fourth electrode pads 76c, 76d and the relay pad 77. Therefore, in the semiconductor device 61, a part of the conductive layers 79, which connect between the electrode pads 76 and between the electrode pads 76 and the relay pad 77, specifically the conductive layer 79, which is used for connection of the terminal for control signals, is routed on the exposed surfaces corresponding to the step surfaces of the step sections of the first through fourth memory elements 69a to 69d.

Among the electrode pads 76 which become the CE terminal and the RB terminal, the electrode pads 76a, 76b of the first and second memory elements 69a, 69b are connected to the relay pad 77 by a conductive layer 792. For the electrode pads 76c, 76d of the third and fourth memory elements 69c, 69d, the electrode pads 76c, 76d are connected by a conductive layer 793, and the conductive layer 793 is routed on the exposed surface, arranged between the adjacent electrode pads 76 of the individual memory elements 69 and connected to the relay pad 77. A part of the conductive layers 79 is routed on the exposed surfaces of the memory elements 69, so that the electrode pads 76 for the control signal can be connected finely to the relay pad 77 of the relay element 75 and therefore to the connection pads 67 of the wiring board 62 by the conductive layer 79.

To route a part of the conductive layers 79 on the exposed surfaces of the memory elements 69, if there is a space between the adjacent electrode pads 76 of the individual memory elements 69 similar to the case of the RB terminal shown in FIG. 16, the conductive layer 79 may be formed directly between the electrode pads 76. Meanwhile, if there is not a space for wire routing between the electrode pads 76 like the CE terminal shown in FIG. 16, the adjacent electrode pads 76 (non-connection pads) are covered with second insulating layers 81, and the conductive layer 79 is formed on them. In other words, the second insulating layers 81 are formed on the exposed surfaces of the memory elements 69a to 69d according to a wiring pattern (forming pattern of wiring for a control terminal) of the conductive layers 79. The conductive layers 79 are partially routed through the second insulating layers 81. The second insulating layers 81 can be formed in the same manner as the first insulating layers 80.

In the semiconductor memory device (semiconductor device) 61 of this embodiment, the conductive layer 79 is partially routed on the exposed surfaces corresponding to the step surfaces of the step sections of the memory elements 69. Therefore, even when it is necessary to connect the each memory element 69 like the terminal for control signals, the electrode pads 76 of the memory elements 69 and the relay pads 77 of the relay element 75 and therefore the connection pads 67 of the wiring board 62 can be connected finely by the conductive layers 79. A routing characteristic of the conductive layers 79 can be enhanced by forming the second insulating layers 81 on the exposed surfaces of the memory elements 69. Therefore, the electrode pads 76 of the memory elements 69 and the relay pads 77 of the relay elements 75 and therefore the connection pads 67 of the wiring board 62 can be connected more finely by the conductive layers 79.

Routing of the conductive layer 79 on the exposed surfaces of the memory elements 69 is effective not only when the element group is configured by using the relay element 75 and the memory elements 69 but also when the element group is configured by using only the plural memory elements 69. At this time, the electrode pads 76 of the memory elements 69 and the connection pads 67 of the wiring board 62 may be connected by the conductive layers 79. Otherwise, wire bonding may be applied to connect the electrode pads 76 of the lowermost memory element 69 and the connection pads 67 of the wiring board 62 after the thickness of the lowermost memory element 69 is increased.

Figure 18:
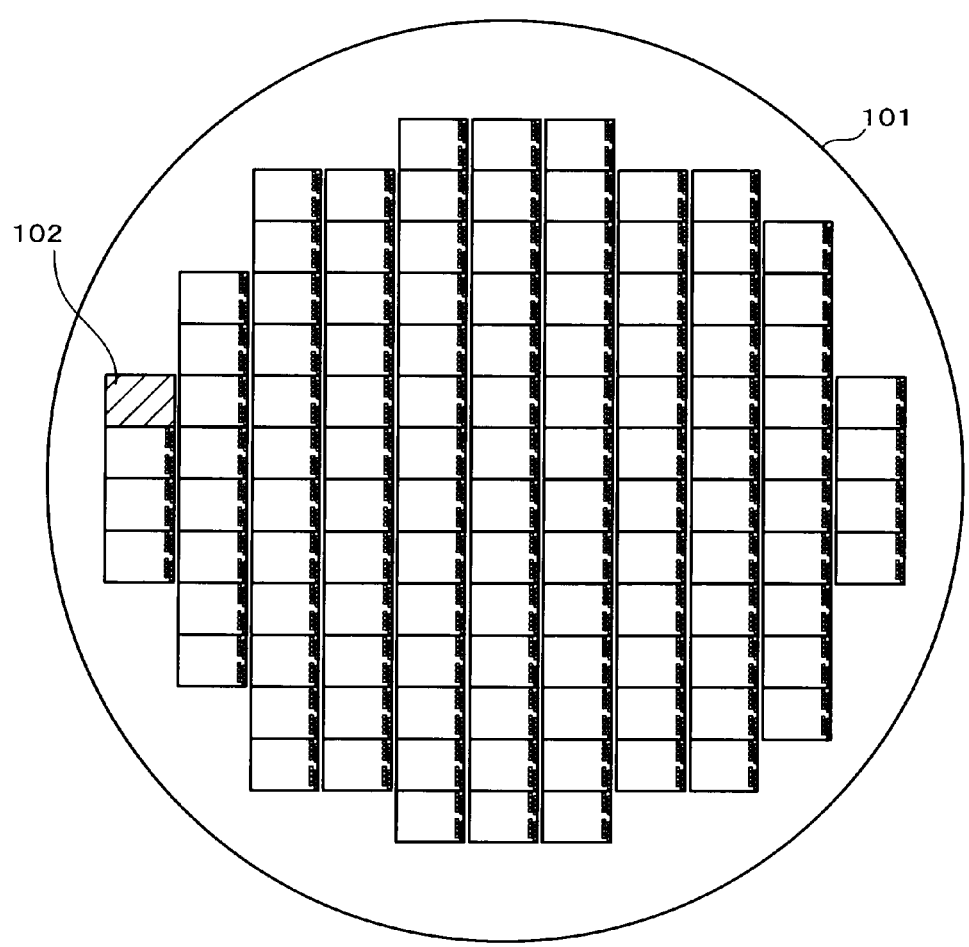
FIG. 18 is a plan view showing a stage of stacking plural memory elements on a semiconductor wafer which becomes a relay element in a production process of the semiconductor device shown in FIG. 14.
Figure 19:
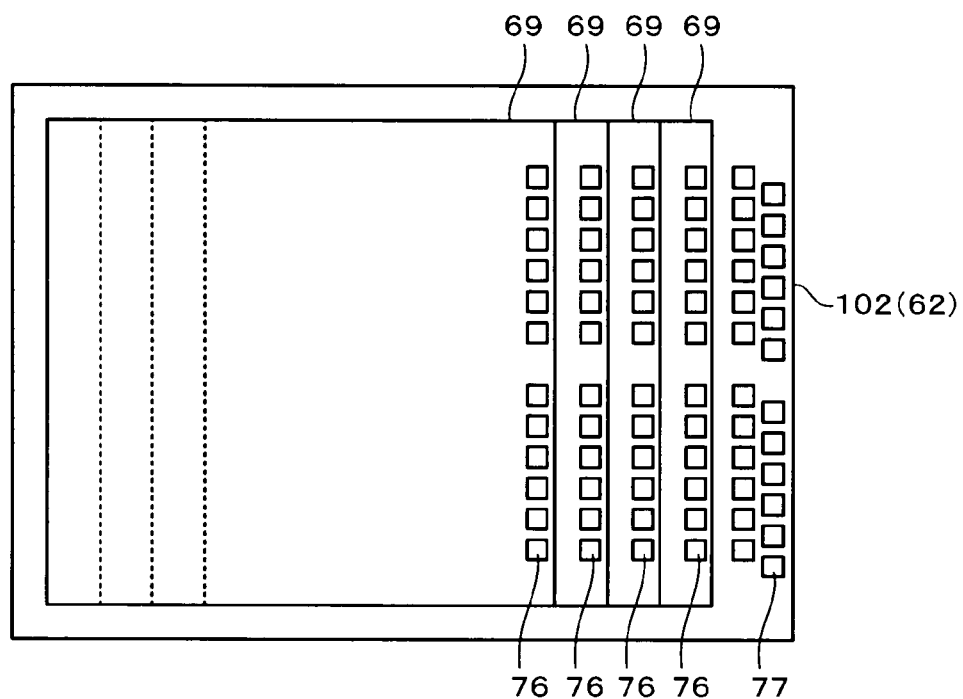
FIG. 19 is a plan view showing an element area equivalent to one relay element of the semiconductor wafer shown in FIG. 18.
Figure 20:
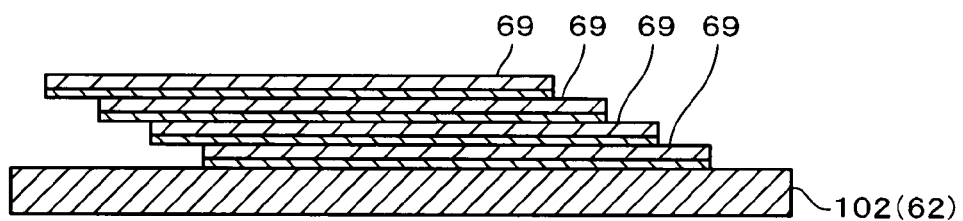
FIG. 20 is a diagram showing a cross section of FIG. 19.

The relay element 75 and the plural memory elements 69 may be stacked sequentially on the wiring board 62, but such a procedure is not limited. As shown in FIG. 18 through FIG. 20, the plural memory elements 69 are sequentially stacked on a semiconductor wafer 101 for the relay elements 75, and the semiconductor wafer 101 is cut to singulate the laminated body of the relay elements 75 and the plural memory elements 69 as the element module. The conductive layer 79 can also be formed on the semiconductor wafer 101. Thus, the production man-hour and production cost of the laminated body of the plural memory elements 69 and the relay elements 75 corresponding to the individual element groups can be reduced. FIG. 19 and FIG. 20 show an element area 102 corresponding to one relay element 75 of the semiconductor wafer 101.

First, the plural memory elements 69 are sequentially stacked on the individual element areas 102 of the semiconductor wafer 101 for the relay elements 75. The plural memory elements 69 are adhered via the adhesive layer. When the semiconductor element 1 of the embodiment described above is applied to the memory element 69, the insulating adhesive layer 13 on the back surface is used for adhesion. Then, an insulating layer and a conductive layer are sequentially formed on the plural memory elements 69 of the individual element areas 102. At this time, a printing device having plural nozzles can be used to reduce the cost of forming the insulating layer and the conductive layer. Subsequently, the semiconductor wafer 101 is cut according to the element area 102 to obtain element modules (laminated bodies of the relay element 75 and the plural memory elements 69) corresponding to the individual element groups.

Besides, a structure which becomes a base of the semiconductor device 61 can be obtained by stacking a required number of the above-described element modules on the wiring board 62. It is also possible to reduce the production man-hour and production cost of the semiconductor device 61 by previously forming a laminated body of the relay elements 75 and the plural memory elements 69. Besides, a defect occurrence rate of the semiconductor device 61 can be suppressed by performing an inspection by using the relay pads 77 of the relay elements 75 at a stage of the element module. If any of the plural memory elements 69 is judged defective as a result of the inspection at the stage of the element module, it is also possible to use as a module for a storage capacity excepting the defective memory elements 69.

As described above, the electrical connection is performed between the electrode pads 76 of the memory elements 69 configuring the individual element groups 71 to 74 and between the electrode pads 76 of the memory elements 69 and the relay pads 77 of the relay elements 75 by the conductive layers 79. Besides, the relay pads 77 of the relay elements 75 configuring the individual element groups 71 to 74 are electrically connected to the connection pads 67 which are arranged on the first pad region 68A of the wiring board 62 through metallic wires 82. The relay pads 77 of the first relay element 75A are electrically connected to the connection pads 67 through first metallic wires 82A. Similarly, the relay pads 77 of the second through fourth relay elements 75B to 75D are electrically connected to the connection pads 67 through second through fourth metallic wires 82B to 82D. For the metallic wires 82, a general Au wire or Cu wire is used.

The electrode pads 76 of the memory elements 69 and the relay pads 77 of the relay elements 75 are connected by the conductive layers 79, and then the relay pads 77 and the connection pads 67 of the wiring board 62 are connected by the metallic wires 82, so that the protection of the memory elements 69 and the connectability with the wiring board 62 can be improved. In other words, since the conductive layers 79 are applied for connection of the electrode pads 76 of the memory elements 69, occurrence of damage at the time of wire bonding of the memory elements 69 can be avoided. Besides, the relay element 75 which is directly connected to the wiring board 62 does not have an element structure, so that ordinary wire bonding can be performed. Therefore, the relay elements 75B to 75D configuring the second through fourth element groups 72 to 74 which are located at the upper stacked positions can be connected easily with the wiring board 62.

In addition, since the insulating resin 78 is charged into the hollow portions below the relay elements 75B to 75D configuring the second through fourth element groups 72 to 74, a defective connection or a clack at the time of wire bonding to the individual relay pads 77 can be prevented from occurring. The structure of connecting the relay element 75 and the wiring board 62 by the metallic wire 82 is effective for not only the stacking of the plural element groups 71 to 74 but also the connection of the wiring board 62 and the relay element 75 of a single element group. As indicated in connection with the production process described above, the stacking of the plural memory elements 69 of the relay element 75 and the formation of the conductive layer 79 can be performed by the wafer process. Therefore, it becomes possible to reduce the production cost by connecting the relay element 75 and the wiring board 62 by performing an ordinary wire bonding process after arranging the laminated body on the wiring board 62.

The controller element 70 is adhered onto the fourth element group 74 (specifically the top memory element 9) via the adhesive layer (unshown). The controller element 70 has a U-shaped pad structure and is provided with electrode pads 83A which are arranged along a first outline side, electrode pads 83B which are arranged along a second outline side and electrode pads 83C which are arranged along a third outline side. Among the electrode pads 83A to 83C, the electrode pads 83A located near the second pad region 68B are electrically connected to the connection pads 67 which are arranged on the second pad region 68B through metallic wires 84A.

The electrode pads 83B which are positioned near the first pad region 68A are electrically connected to the connection pads 67 which are arranged on the first pad region 68A through metallic wires 84B. The electrode pads 83C which are arranged along the third outline side are hardly connected directly to the connection pads 67 which are arranged on the first pad region 68A, so that a relay element 85 is arranged to the controller element 70. The electrode pads 83C which are arranged along the third outline side are connected to the connection pads 67 which are arranged on the first pad region 68A via the relay element 85.

The relay element 85 has electrode pads (relay pads) 86A, 86B which are arranged along one outline side and the other outline side which is orthogonal to the former. The controlling relay element 85 is arranged to have the electrode pads 86A opposite to the electrode pads 83C of the controller element 70 and the electrode pads 86B positioned near the first pad region 68A. The electrode pads 86A of the relay element 85 are connected to the electrode pads 83C of the controller element 70 through first relay metallic wires 87A. The electrode pads 86B are electrically connected to the connection pads 67 through second relay metallic wires 87B. The relay element 85 has a wiring layer for connecting the electrode pads 86A and the electrode pads 86B.

A sealing resin layer 88 formed of, for example, an epoxy resin is mold formed on the second main surface 62b of the wiring board 62 on which the memory elements 69 and the controller element 70 are mounted. The memory elements 69 and the controller element 70 are integrally sealed together with the metallic wires 82, 84, 87 by the sealing resin layer 88. A slope portion 89 is formed at a leading end of the sealing resin layer 88 to indicate the front of the memory card. A tab 90 is formed at a rear part of the sealing resin layer 88 by partially protruding the sealing resin. Thus, the semiconductor memory device 61 which is used as a semiconductor memory card is configured. The sealing resin layer 88 is not shown in FIG. 1.

The semiconductor memory device 61 configures solely a semiconductor memory card (e.g., micro SD card) without using a housing case such as a base card. Therefore, the sealing resin layer 88 is in a state directly exposed outside. Namely, the semiconductor memory device 61 is a casing-less semiconductor memory card with the sealing resin layer 88 externally exposed. Therefore, a cutout portion and a recess portion which indicate the forward and backward direction and the front and rear surface direction of the above-described memory card, and the slope portion 89 are formed on the semiconductor memory device 61.

In a case where a casing-less micro SD card is configured of the semiconductor memory device 61, the thickness (card thickness) of the semiconductor memory device 61 is set to fall in a range of, for example, 700 to 760 µm. The laminate thickness (element thickness) of the memory element 69 and the controller element 70 is required to fall in a range of the card thickness with the addition of the thickness of the wiring board 62 and the thickness (resin thickness on the element) of the sealing resin layer 88 on the controller element 70. The semiconductor memory device 61 can be provided with both high capacity and high reliability by extremely decreasing the thickness of the memory element 69 and applying the conductive layer 79. In other words, it becomes possible to enhance the production yield and reliability of the thin and high capacity semiconductor memory device 61.

The semiconductor memory device 61 has four element groups, and the individual element groups are configured of one relay element 75 and four memory elements 69. The semiconductor memory device 61 has a total of four relay elements 75 and sixteen memory elements 69. For example, when it is determined that the wiring board 62 has a thickness of 110 µm, the relay element 75, the memory element 69 and the controller element 70 each have a thickness of 18 μm, the adhesive layer of the first relay element 75A has a thickness of 20 μm, the element adhesive layers other than them have a thickness of 5 μm, and the sealing resin layer 88 has a resin thickness of 152 μm on the elements, and their total thickness becomes 760 μm. If the sixteen memory elements 69 each having a storage capacity of 1 GB are used, a 16-GB micro SD card can be realized by the semiconductor memory device 61.

As described above, damage to the memory elements 69 can be suppressed by applying the conductive layer 79 for connection between the electrode pads 76 of the memory elements 69. Therefore, it becomes possible to enhance the reliability of the semiconductor memory device 61 even when the memory elements 69 are decreased in thickness. The semiconductor memory device 61 of this embodiment is effective when the memory elements 69 are decreased to have a thickness of, for example, 30 μm or less, and further 20 μm or less. The memory elements 69 of this embodiment have a thickness of, for example, 30 μm or less, and further 20 μm or less. But, the thickness of the memory elements 69 is not limited to the above, and the conductive layer 79 can be applied even when the memory elements 69 having a thickness of, for example, about 50 μm are used.

The number of the element groups stacked on the wiring board 62 and the number of the memory elements (semiconductor elements) 69 configuring the individual element groups are not limited to the embodiments described above. The individual element groups are adequate if they have the plural memory elements (semiconductor elements) 69. The number of the element groups can be set adequately according to, for example, the storage capacity of the semiconductor memory device 61. The semiconductor memory device 61 may be configured of a single element group (having plural memory elements 69) depending on situations.

The semiconductor memory device 61 of this embodiment is effective for a casing-less semiconductor memory card which is configured of it solely, but a semiconductor memory card using a casing such as a base card is not necessarily excluded. Besides, it can also be applied to a semiconductor memory device other than the semiconductor memory card. Specifically, the device structure of this embodiment can also be applied to a semiconductor memory device having a BGA package structure or an LGA package structure.

The semiconductor element and semiconductor device according to the present invention are not limited to the above-described embodiments. The present invention can be applied to semiconductor elements having various types of structures to be mounted on the circuit substrate, and also semiconductor devices having various types of structures having plural semiconductor elements stacked and mounted on the circuit substrate. Such semiconductor elements and semiconductor devices are also included in the present invention. Specific structures of the semiconductor device can be modified in various ways if the basic structure of the present invention is satisfied. The embodiments of the present invention can be expanded or modified within the scope of technical idea of the invention, and the expanded and modified embodiments are also included in the technical scope of the invention.

What is claimed is:

1. A semiconductor device, comprising:
    a wiring board having connection pads;
    an element group including a relay element, disposed on the wiring board, having relay pads arranged along its outline side, and a plurality of semiconductor elements, disposed on the relay element, having electrode pads arranged along its outline side, the relay element and the plurality of semiconductor elements being stacked to have a step-like shape with the outline sides directed in the same direction and to expose the relay pads and the electrode pads;
    conductive layers which electrically connect the electrode pads of the semiconductor elements and the relay pads of the relay element;
    metallic wires which electrically connect the relay pads of the relay element and the connection pads of the wiring board; and
    a sealing resin layer which is formed on the wiring board to seal the element group together with the metallic wires.

2. The semiconductor device according to claim 1, further comprising an insulating layer which covers sidewall surfaces corresponding to stepped portions of step sections of the semiconductor elements.

3. The semiconductor device according to claim 1, wherein the conductive layer includes a coated layer of a conductive material.

4. A semiconductor device, comprising:
    a wiring board having connection pads;
    a first element group including a first relay element, disposed on the wiring board, having relay pads arranged along its outline side, and a plurality of semiconductor elements, disposed on the first relay element, having electrode pads arranged along its outline side, the first relay element and the semiconductor elements being stacked to have a step-like shape with the outline sides directed in the same direction and to expose the relay pads and the electrode pads;
    first conductive layers which electrically connect the electrode pads of the semiconductor elements configuring the first element group and the relay pads of the first relay element;
    first metallic wires which electrically connect the relay pads of the first relay element and the connection pads of the wiring board;
    a second element group including a second relay element, disposed on the first element group, having relay pads arranged along its outline side, and a plurality of semiconductor elements, disposed on the second relay element, having electrode pads arranged along its outline side, the second relay element and the semiconductor elements being stacked to have a step-like shape with the outline sides directed in the same direction and to expose the relay pads and the electrode pads;
    second conductive layers which electrically connect the electrode pads of the semiconductor elements configuring the second element group and the relay pads of the second relay element;
    second metallic wire which electrically connect the relay pads of the second relay element and the connection pads of the wiring board; and
    a sealing resin layer which is formed on the wiring board to seal the first and second element groups together with the first and second metallic wires.

5. The semiconductor device according to claim 4, further comprising insulating layers which cover sidewall surfaces corresponding to stepped portions of step sections of the semiconductor elements of the first and second element groups.

6. The semiconductor device according to claim 4, wherein the semiconductor elements configuring the second element group are stacked to have the step-like shape in the same direction as the stepped direction of the semiconductor elements configuring the first element group.

7. The semiconductor device according to claim 4, wherein an insulating resin is filled between the first relay element and the second relay element to cover step sections of the semiconductor elements of the first element group.

8. A semiconductor device, comprising:
a wiring board having connection pads;
an element group including a plurality of semiconductor elements, disposed on the wiring board, having electrode pads arranged along its outline side, the semiconductor elements being stacked to have a step-like shape with the outline sides directed in the same direction and to expose the electrode pads;
conductive layers which connect at least between the electrode pads of the semiconductor elements; and
a sealing resin layer which is formed on the wiring board to seal the element group,
wherein the conductive layers are partially routed on exposed surfaces corresponding to step surfaces of step sections of the semiconductor elements, wherein the element group includes a relay element, interposed between the wiring board and the semiconductor elements, having relay pads arranged along its outline side, and the relay pads are electrically connected to the electrode pads via the conductive layers and also electrically connected to the connection pads via metallic wires.

9. The semiconductor device according to claim 8, further comprising:
first insulating layers which cover sidewall surfaces corresponding to the stepped portions of the step section of the semiconductor elements; and
second insulating layers which are formed according to a wiring pattern of the conductive layers on the exposed surfaces of the semiconductor elements.

* * * * *